United States Patent
Miki et al.

(10) Patent No.: US 8,569,794 B2
(45) Date of Patent: Oct. 29, 2013

(54) GROUP III NITRIDE SEMICONDUCTOR DEVICE AND METHOD FOR MANUFACTURING THE SAME, GROUP III NITRIDE SEMICONDUCTOR LIGHT-EMITTING DEVICE AND METHOD FOR MANUFACTURING THE SAME, AND LAMP

(75) Inventors: Hisayuki Miki, Chiba (JP); Yasunori Yokoyama, Ichihara (JP)

(73) Assignee: Toyoda Gosei Co., Ltd., Aichi-ken (JP)

( * ) Notice: Subject to any disclaimer, the term of this patent is extended or adjusted under 35 U.S.C. 154(b) by 339 days.

(21) Appl. No.: 12/921,695

(22) PCT Filed: Mar. 6, 2009

(86) PCT No.: PCT/JP2009/054310
§ 371 (c)(1),
(2), (4) Date: Dec. 7, 2010

(87) PCT Pub. No.: WO2009/113458
PCT Pub. Date: Sep. 17, 2009

(65) Prior Publication Data
US 2011/0101391 A1    May 5, 2011

(30) Foreign Application Priority Data

Mar. 13, 2008  (JP) .................................. 2008-064111

(51) Int. Cl.
*H01L 33/00*    (2010.01)
(52) U.S. Cl.
USPC ................. 257/103; 257/79; 257/80; 257/98; 257/93; 257/82; 257/89; 438/48; 438/604; 438/620; 438/22

(58) Field of Classification Search
USPC ........ 257/103, 79, 80, 82, 89, 93, 98; 438/48, 438/604, 620, 22, E21.108
See application file for complete search history.

(56) References Cited

U.S. PATENT DOCUMENTS

| 7,132,691 B1 * | 11/2006 | Tanabe et al. ................... 257/79 |
| 7,585,690 B2 * | 9/2009 | Miki et al. ....................... 438/48 |
| 8,097,482 B2 * | 1/2012 | Hanawa et al. ................. 438/46 |

(Continued)

FOREIGN PATENT DOCUMENTS

| EP | 1160882 A2 | 12/2001 |
| EP | 1199388 A1 | 4/2002 |

(Continued)

OTHER PUBLICATIONS

Isamu Akasai, et al.; "Crystal Growth and Conductivity Control of Group III Nitride Semiconductors and Their Application to Short Wavelength Light Emitters"; Jpn. J. Appl. Phys.; vol. 36, Pt. 1; No. 9A; Sep. 1997; pp. 5393-5408.

(Continued)

*Primary Examiner* — Telly Green
(74) *Attorney, Agent, or Firm* — Sughrue Mion, PLLC

(57) ABSTRACT

A Group III nitride semiconductor device of the present invention is obtained by laminating at least a buffer layer (12) made of a Group III nitride compound on a substrate (11), wherein the buffer layer (12) is made of AlN, and a lattice constant of a-axis of the buffer layer (12) is smaller than a lattice constant of a-axis of AlN in a bulk state.

10 Claims, 7 Drawing Sheets

(56) References Cited

U.S. PATENT DOCUMENTS

| | | | |
|---|---|---|---|
| 2002/0020850 A1 | 2/2002 | Shibata et al. | |
| 2008/0035908 A1* | 2/2008 | Sakai | 257/13 |
| 2008/0116478 A1* | 5/2008 | Miki et al. | 257/103 |
| 2008/0283822 A1* | 11/2008 | Yui | 257/13 |
| 2009/0068779 A1* | 3/2009 | Nakahara | 438/47 |
| 2009/0289270 A1* | 11/2009 | Hanawa et al. | 257/98 |

FOREIGN PATENT DOCUMENTS

| | | | |
|---|---|---|---|
| EP | 1755172 A1 | 2/2007 | |
| JP | 4-297023 A | 10/1992 | |
| JP | 5-86646 B2 | 12/1993 | |
| JP | 9-83016 A | 3/1997 | |
| JP | 10-075018 A | 3/1998 | |
| JP | 3026087 B2 | 3/2000 | |
| JP | 2002-16009 A | 1/2002 | |
| JP | 2002-176197 A | 6/2002 | |
| JP | 2003-045900 A | 2/2003 | |
| JP | 3440873 A | 8/2003 | |
| JP | 2003-264155 A | 9/2003 | |
| JP | 2005-203605 A | 7/2005 | |
| JP | 3700492 B2 | 9/2005 | |
| JP | 2005-277374 A | 10/2005 | |
| JP | 2007-095786 A | 4/2007 | |
| JP | 2008-021745 A | 1/2008 | |
| JP | 2008-047763 A | 2/2008 | |

OTHER PUBLICATIONS

N. Kumar, et al.; "Deposition of Aluminum Nitride Films Using Rf Reactive Sputtering"; Mat. Res. Soc. Symp. Proc.; vol. 68; 1986; Materials Research Society; pp. 357-363.

Korean Office Action dated Oct. 20, 2011 for corresponding Korean Patent Application No. 10-2010-7021247.

Isamu Akasaki, et al.; "Crystal Growth and Conductivity Control of Group III Nitride Semiconductors and Their Application to Short Wavelength Light Emitters"; Jpn. J. Appl. Phys.; vol. 36, Pt. 1; No. 9A; Sep. 1997; pp. 5393-5408.

European Search Report Dated Sep. 21, 2011 in counterpart European Application EP 09718583.

YM Vaillent, et al.; "Dependence of the Residual Strain in GaN on the AlN Buffer Layer Annealing Parameters"; Mat. Res. Soc. Symp. Proc.; vol. 468; 1997; Material Research Society; pp. 173-177.

H. Takahashi, et al.; "G-GIXD characterization of GaN grown by laser Mbe"; Journal of Crystal Growth; 2002; pp. 1158-1162.

O. Ambacher et al.; "Growth of GaN/ AlN by low-pressure MOCVD using triethylgallium and tritertbutylaluminium"; Journal of Crystal Growth; 1996; pp. 1-7.

Jun Soda, et al.; "Effects of 6 H-SiC reconstruction on lattice relaxation of AlN buffer layers molecular-beam epitaxial growth of GaN"; Applied Physics Letters; vol. 81; No. 27; Dec. 2002; pp. 5141-5143.

Japanese Notice of Allowance, mailed Mar. 12, 2013 from the Japanese Patent Office, in corresponding Japanese Patent Application No. 2010-178847, along with an English translation thereof.

* cited by examiner

GROUP III NITRIDE SEMICONDUCTOR DEVICE AND METHOD FOR MANUFACTURING THE SAME, GROUP III NITRIDE SEMICONDUCTOR LIGHT-EMITTING DEVICE AND METHOD FOR MANUFACTURING THE SAME, AND LAMP

TECHNICAL FIELD

The present invention relates to a Group III nitride semiconductor device and a method for manufacturing the same, a Group III nitride semiconductor light-emitting device and a method for manufacturing the same, and a lamp, the Group III nitride semiconductor device being obtained by laminating a Group III nitride semiconductor which is suitably used for a light emitting diode (LED), a laser diode (LD), an electronic device, and the like, and represented by the general formula $Al_aGa_bIn_cN$ ($0 \le a \le 1$, $0 \le b \le 1$, $0 \le c \le 1$, and $a+b+c=1$).

Priority is claimed on Japanese Patent Application No. 2008-064111, filed Mar. 13, 2008, the content of which is incorporated herein by reference.

BACKGROUND ART

Group III nitride semiconductors offer a direct transition over a band gap energy from visible light to ultraviolet rays, and excel in the light emission efficiency, and thus have been manufactured as semiconductor light-emitting devices such as a light emitting diode (LED) and a laser diode (LD) for use in various applications. In addition, when used for an electronic device, Group III nitride semiconductors have a potential to provide electronic devices having characteristics superior to those using conventional Group III-V compound semiconductors.

Such Group III nitride compound semiconductors are, in general, produced from trimethyl gallium, trimethyl aluminum, and ammonia as raw materials through a Metal Organic Chemical Vapor Deposition (MOCVD) method. The MOCVD method is a method in which a vapor of a raw material is introduced into a carrier gas to convey the vapor to the surface of a substrate and decompose the raw material on the surface of the heated substrate, to thereby grow a crystal.

Hitherto, a single crystalline wafer of a Group III nitride semiconductor has not been commercially available, and Group III nitride semiconductors are, in general, produced by growing a crystal on a single crystalline wafer of a different material. There is a large lattice mismatching between such a different kind of substrate and a Group III nitride semiconductor crystal to be epitaxially grown thereon. For example, when gallium nitride (GaN) is grown directly on a substrate made of sapphire ($Al_2O_3$), there is a lattice mismatching of 16% therebetween. Also, when gallium nitride is directly grown on a substrate made of SiC, there is a lattice mismatching of 6% therebetween. In general, a large lattice mismatching as in the above leads to a problem in that it is difficult to epitaxially grow a crystal directly on a substrate, or a crystal, even if grown, can not gain excellent crystallinity.

Thus, for epitaxially growing a Group III nitride semiconductor crystal on a single crystalline sapphire substrate or a single crystalline SiC substrate through a Metal Organic Chemical Vapor Deposition (MOCVD) method, a method has been proposed and generally performed in which, firstly, a layer called a low temperature buffer layer made of aluminum nitride (AlN) or aluminum nitride gallium (AlGaN) is laminated on a substrate, and then a Group III nitride semiconductor crystal is epitaxially grown thereon at a high temperature (for example, Patent Documents 1 and 2).

However, in the methods disclosed in the Patent Documents 1 and 2, lattice match is not basically achieved between a substrate and a Group III nitride semiconductor crystal grown thereon. Therefore, the state is prepared in which a dislocation called a threading dislocation that extends toward a surface is included in a grown crystal. As a result, distortion occurs in a crystal, and sufficient light emission strength cannot be obtained unless the structure is appropriately adjusted. In addition, there was a problem such as a deterioration of productivity.

In addition, a method has been proposed in which the aforementioned buffer layer is formed by a method other than the MOCVD method, and for example, a method has been proposed in which a buffer layer is formed by high frequency sputtering, and a crystal having the same composition is grown thereon by an MOCVD method (for example, Patent Document 3). However, the method disclosed in Patent Document 3 has a problem in that an excellent crystal cannot be stably laminated on a substrate.

Thus, in order to stably produce an excellent crystal, there have been proposed a method for annealing a buffer layer in a mixed gas made of ammonia and hydrogen on completion of its growth (for example, Patent Document 4), and a method for forming a buffer layer by DC sputtering at a temperature of 400° C. or higher (for example, patent document 5). However, in any of the methods disclosed in the Patent Documents 4 and 5, there was the problem that it was difficult to stably obtain a good crystal when lattice mismatch occurred between a substrate and a Group III nitride semiconductor crystal grown thereon.

In addition, in any of the Patent Documents 1 to 5, there was the big problem that the crystallinity of the (10-10) plane of the ground layer made of GaN, which strongly relates to the dislocation density of a crystal and has an important role to improve properties of the light-emitting device such as an LED, was particularly poor.

[Patent Document 1]
Japanese Patent No. 3026087
[Patent Document 2]
Japanese Unexamined Patent Application, First Publication No. Hei 4-297023
[Patent Document 3]
Japanese Examined Patent Application, Second Publication No. Hei 5-86646
[Patent Document 4]
Japanese Patent No. 3440873
[Patent Document 5]
Japanese Patent No. 3700492

DISCLOSURE OF INVENTION

Problems to be Solved by the Invention

The present invention has been completed in light of the problems described above, and has an object of providing a Group III nitride semiconductor device with good device properties, in which a buffer layer with good orientation and high uniformity is formed on a substrate, and a layer made of a Group III nitride semiconductor with good crystallinity is formed on the buffer layer, and a manufacturing method thereof. In addition, the present invention has another object of providing a Group III nitride semiconductor light-emitting device and a manufacturing method thereof, and a lamp.

Means to Solve the Problems

The present inventors have intensively studied in order to form a film of a Group III nitride semiconductor crystal with a good crystallinity, and have found that the appropriate control of the lattice constants of respective crystal axes of a buffer layer formed on a substrate improves the uniformity of a buffer layer and moreover the crystallinity of a Group III nitride semiconductor formed on the buffer layer. Thus, the present invention has been completed.

The present invention relates to the aspects described below.

[1] A Group III nitride semiconductor device which is obtained by laminating at least a buffer layer made of a Group III nitride compound on a substrate, wherein
the buffer layer is made of AlN, and
a lattice constant of a-axis of the buffer layer is smaller than a lattice constant of a-axis of AlN in a bulk state.

[2] The Group III nitride semiconductor device according to [1], wherein lattice constants of the buffer layer satisfy a relationship represented by a formula (1):

$$(c_0-c)/(a_0-a) \geq -1.4 \qquad (1)$$

(in the formula (1), $c_0$ represents a lattice constant of c-axis of a bulky AlN, c represents a lattice constant of c-axis of the buffer layer, $a_0$ represents a lattice constant a-axis of bulky MN, and a represents a lattice constant of a-axis of the buffer layer).

[3] The Group III nitride semiconductor device according to [1] or [2], wherein a lattice constant of c-axis of the buffer layer is 5 Å or more.

[4] The Group III nitride semiconductor device according to any one of [1] to [3], wherein the buffer layer is formed of a single crystalline structure.

[5] The Group III nitride semiconductor device according to any one of [1] to [3], wherein the buffer layer is formed of an assembly of columnar crystals.

[6] The Group III nitride semiconductor device according to any one of [1] to [5], wherein a thickness of the buffer layer is within a range of 10 to 500 nm.

[7] The Group III nitride semiconductor device according to any one of [1] to [5], wherein a thickness of the buffer layer is within a range of 20 to 100 nm.

[8] The Group III nitride semiconductor device according to any one of [1] to [7], wherein the buffer layer is formed so as to cover at least 90% of surface of the substrate.

[9] The Group III nitride semiconductor device according to any one of [1] to [8], wherein the substrate is made of sapphire.

[10] The Group III nitride semiconductor device according to any one of [1] to [9], wherein the buffer layer is formed by using plasma to activate and react a Group V element-containing gas and a metal material.

[11] The Group III nitride semiconductor device according to [10], wherein the buffer layer is formed by a reactive sputtering method.

[12] The Group III nitride semiconductor device according to any one of [1] to [11], wherein a ground layer made of a Group III nitride semiconductor is formed on the buffer layer.

[13] The Group III nitride semiconductor device according to [12], wherein the ground layer is made of GaN.

[14] The Group III nitride semiconductor device according to [12] or [13], wherein the ground layer formed on the buffer layer is formed by an MOCVD method.

[15] The Group III nitride semiconductor device according to any one of [12] to [14], wherein a half maximum full-width of X-ray rocking curve of a (0002) plane of the ground layer is 100 arcsec or less.

[16] The Group III nitride semiconductor device according to any one of [12] to [15], wherein a half maximum full-width of X-ray rocking curve of a (10-10) plane of the ground layer is 300 arcsec or less.

[17] A Group III nitride semiconductor light-emitting device which is obtained by sequentially laminating at least an n-type semiconductor layer, a light-emitting layer, and a p-type semiconductor layer on the ground layer of the Group III nitride semiconductor device according to any one of [12] to [16].

[18] A method for manufacturing a Group III nitride semiconductor device, including: laminating at least a buffer layer made of a Group III nitride compound on a substrate, wherein
the buffer layer is made of AlN under a condition where a lattice constant of a-axis of the buffer layer is smaller than a lattice constant of a-axis of AlN in a bulk state.

[19] The method for manufacturing a Group III nitride semiconductor device according to [1,8], wherein
the buffer layer is formed under a condition where lattice constants of the buffer layer satisfy a relationship represented by a formula (1):

$$(c_0-c)/(a_0-a) \geq -1.4 \qquad (1)$$

(in the formula (1), $c_0$ represents a lattice constant of c-axis of a bulky AlN, c represents a lattice constant of c-axis of the buffer layer, $a_0$ represents a lattice constant a-axis of bulky AlN, and a represents a lattice constant of a-axis of the buffer layer).

[20] The method for manufacturing a Group III nitride semiconductor device according to [18] or [19], wherein a lattice constant of c-axis of the buffer layer is 5 Å or more.

[21] The method for manufacturing a Group III nitride semiconductor device according to any one of [18] to [20], wherein the buffer layer is formed by using plasma to activate and react a Group V element-containing gas and a metal material.

[22] The method for manufacturing a Group III nitride semiconductor device according to [21], wherein the buffer layer is formed by a reactive sputtering method.

[23] The method for manufacturing a Group III nitride semiconductor device according to any one of [18] to [22], wherein the buffer layer is produced under a condition where an ultimate vacuum degree within a chamber of a film-forming apparatus is $1.0 \times 10^{-3}$ Pa or less.

[24] The method for manufacturing a Group III nitride semiconductor device according to any one of [18] to [23], wherein dummy discharge is performed in the chamber of the film-forming apparatus, and then, the buffer layer is formed.

[25] The method for manufacturing a Group III nitride semiconductor device according to any one of [18] to [24], wherein the substrate is subjected to a pretreatment using a plasma treatment, and then, the buffer layer is formed.

[26] The method for manufacturing a Group III nitride semiconductor device according to [25], wherein the plasma treatment is sputter-cleaning.

[27] The method for manufacturing a Group III nitride semiconductor device according to any one of [18] to [26], wherein the buffer layer is formed while setting a temperature of the substrate within a range from 400° C. to 800° C.

[28] The method for manufacturing a Group III nitride semiconductor device according to any one of [18] to [27], wherein the ground layer is formed on the buffer layer by using an MOCVD method.

[29] A method for manufacturing a Group III nitride semiconductor light-emitting device, comprising sequentially laminating at least an n-type semiconductor layer, a light-emitting layer, and a p-type semiconductor layer on the ground layer of the Group III nitride semiconductor device obtained by the manufacturing method according to [28].

[30] A Group III nitride semiconductor device which is obtained by the manufacturing method according to any one of [18] to [28].

[31] A Group III nitride semiconductor light-emitting device which is obtained by the manufacturing method according to [29].

[32] A lamp which is obtained by using the Group III nitride semiconductor light-emitting device according to [17] or [31].

EFFECT OF THE INVENTION

According to a Group III nitride semiconductor of the present invention, the buffer layer is made of AlN, and the lattice constant of a-axis of the buffer layer is smaller than the lattice constant of a-axis of AlN in a bulk state. Therefore, it is possible to obtain the buffer layer which has a highly uniform crystal and is well aligned. In addition, the crystallinity of the ground layer, which is formed on the buffer layer and is made of a Group III nitride semiconductor, is improved. As a result, it is possible to obtain a Group III nitride semiconductor with good device properties. In addition, a Group III nitride semiconductor light-emitting device of the present invention is obtained by sequentially laminating an n-type semiconductor layer, a light-emitting layer, and a p-type semiconductor layer on the ground layer of the Group III nitride semiconductor device, and therefore, has good light-emitting properties.

DESCRIPTION OF THE REFERENCE SYMBOLS

Figure 1:
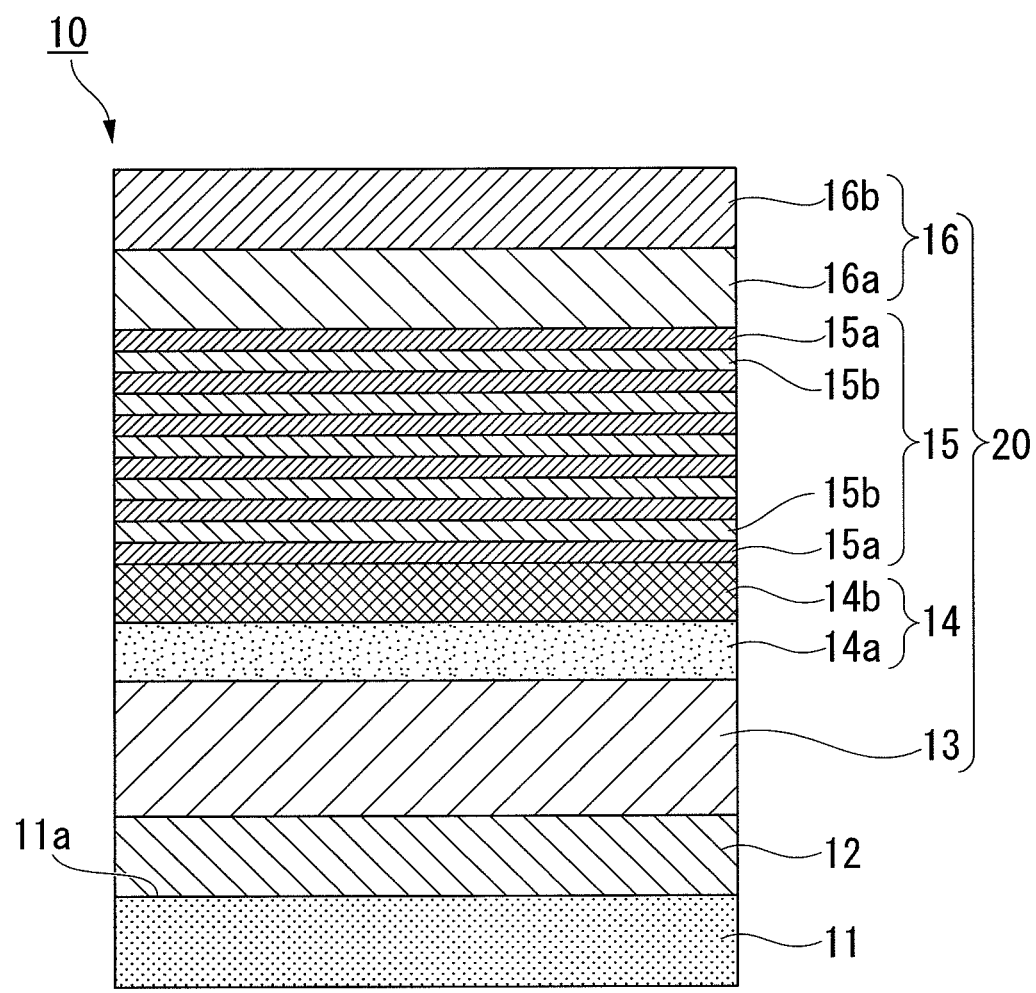
FIG. 1 is a schematic diagram for explaining an example of a Group III nitride semiconductor device (a Group III nitride semiconductor light-emitting device) according to the present invention, showing a cross-sectional structure of a laminated semiconductor.

1: Group III nitride semiconductor light-emitting device
10: Laminated semiconductor (Group III nitride semiconductor device)
11: Substrate
11a: Surface
12: Buffer layer
13: Ground layer
14: N-type semiconductor layer
15: Light-emitting layer
16: P-type semiconductor layer
3: Lamp
40: Sputtering apparatus (film-forming apparatus)
41: Chamber

BEST MODE FOR CARRYING OUT THE INVENTION

Hereunder is a description of one embodiment of a Group III nitride semiconductor device and a manufacturing method thereof, a Group III nitride semiconductor light-emitting device and a manufacturing method thereof, and a lamp according to the present invention, with appropriate reference to FIG. 1 to FIG. 8.

[Group III Nitride Semiconductor Device (Group III Nitride Semiconductor Light-Emitting Device)]

In the Group III nitride semiconductor device of the present embodiment (hereunder, may be abbreviated as a semiconductor device), at least the buffer layer 12 made of a Group III nitride compound is formed on the substrate 11, the buffer layer 12 is made of AlN, and the lattice constant of a-axis of the buffer layer 12 is smaller than the lattice constant of a-axis of AlN in a bulk state (see the laminated semiconductor 10 shown in FIG. 1). Moreover, in the semiconductor device of the present embodiment, the lattice constants of the buffer layer 12 preferably satisfy the above relationship as well as the relationship represented by the formula (1):

$$(c_0-c)/(a_0-a) \geq -1.4 \qquad (1)$$

(in the formula (1), $c_0$ represents the lattice constant of c-axis of a bulky AlN, c represents the lattice constant of c-axis of the buffer layer, $a_0$ represents the lattice constant a-axis of bulky AlN, and a represents the lattice constant of a-axis of the buffer layer).

<Laminated Structure of Semiconductor>

FIG. 1 is a schematic diagram for explaining an example of a semiconductor according to the present invention, which is a schematic cross-sectional diagram showing an example of a laminated semiconductor in which a Group III nitride semiconductor is formed on a substrate.

In the laminated semiconductor 10 (the Group III nitride semiconductor device, the Group III nitride semiconductor light-emitting device) shown in FIG. 1, on the substrate 11 is laminated a buffer layer 12 which is made of a Group III nitride compound and has the lattice constants that satisfy the relationship represented by the aforementioned formula (1). Also, a ground layer 13 is formed on the buffer layer 12 in an example shown in FIG. 1.

Moreover, in the laminated semiconductor 10 of an example shown in FIG. 1, an n-type semiconductor layer 14, a light-emitting layer 15, and a p-type semiconductor layer 16 are further sequentially laminated on the ground layer 13, and a LED structure (a semiconductor layer 20) comprised of these layers is formed. In this manner, the laminated semiconductor 10 is formed as the Group III nitride semiconductor light-emitting device.

Hereunder is a detailed description of the laminated structure of the Group III nitride semiconductor device (the Group III nitride semiconductor light-emitting device) of the present embodiment.

[Substrate]

As a material of the substrate 11, there is no limitation, but it is preferable to use sapphire.

In general, a material of a substrate on which a Group III nitride compound semiconductor crystal is laminated may be a substrate material on the surface of which a Group III nitride compound semiconductor crystal can epitaxially grow. Examples thereof include sapphire, SiC, silicon, zinc oxide, magnesium oxide, manganese oxide, zirconium oxide, manganese oxide zinc iron, magnesium oxide aluminum, zirconium borate, gallium oxide, indium oxide, lithium oxide gallium, lithium oxide aluminum, neodymium oxide gallium, lantern oxide strontium aluminum tantalum, strontium oxide titanium, titanium oxide, hafnium, tungsten, and molybdenum. Among them, a material having a hexagonal crystal structure such as sapphire and SiC is preferably used for the substrate, since a Group III nitride semiconductor having excellent crystallinity can be laminated thereon. It is most preferable to use sapphire.

In addition, regarding the size of the substrate, those having a diameter of about two inches are usually used, while those having a diameter of four to six inches can also be used for the Group III nitride semiconductor device of the present invention.

Among the aforementioned substrate materials, some oxide substrates and metal substrates are known to cause chemical decomposition by being contacted with ammonia at a high temperature. If such an oxide substrate or a metal substrate is used, it is effective to form a buffer layer without using ammonia and then to form a ground layer, which will be described later, with ammonia, in terms of prevention of such chemical decomposition of the substrate because the buffer layer of the present embodiment acts as a coat layer. In addition, in general, the temperature of the substrate can be kept low in a sputtering method. Hence, even if a substrate made of a material decomposable at high temperatures is used, each layer can be formed on the substrate without damaging the substrate 11.

[Buffer Layer]

The buffer layer 12 is laminated on the substrate 11 made of the aforementioned material. Moreover, the buffer layer 12 is made of AlN, and for example, can be formed by the reactive sputtering method which uses plasma to activate and react a Group V element-containing gas and a metal material.

A film formed by a method using plasma of a metal material as shown in the present embodiment has an effect of readily attaining orientation.

The crystal of the Group III nitride forming such a buffer layer has a crystal structure of hexagonal system, and can be formed into a single crystalline film by controlling film formation conditions. Moreover, the crystal of the Group III nitride can also be in a form of a columnar crystal made of an aggregate structure that is basically a hexagonal column, by controlling the above film formation conditions. The columnar crystal described herein refers to a crystal in which adjacent crystal grains are separated since grain boundaries are formed therebetween, and the crystal itself is in a columnar shape in a longitudinal section.

The buffer layer 12 preferably takes a single crystalline structure, in terms of the buffer function. As described above, the crystal of the Group III nitride has a crystal structure of a hexagonal system, and forms a structure that is basically a hexagonal column. The crystal of the Group III nitride is capable of forming a crystal film grown in the in-plane direction, by controlling film formation conditions or the like. When the buffer layer 12 having such a single crystalline structure is formed on the substrate 11, the buffer function of the buffer layer 12 effectively works. Therefore, the layer of the Group III nitride semiconductor to be formed thereon will become a crystal film having excellent orientation and crystallinity.

The thickness of the buffer layer 12 is preferably within a range of 10 to 500 nm. By setting the thickness of the buffer layer 12 within this range, the buffer layer 12 can attain excellent orientation, have the lattice constants that satisfy the relationship represented by the aforementioned formula (1), and effectively function as a coat layer upon formation of respective layers made of Group III nitride semiconductors on the buffer layer 12.

If the thickness of the buffer layer 12 is less than 10 nm, the abovementioned function as a coat layer may become insufficient. In addition, if the buffer layer 12 is formed with a thickness of more than 500 nm, it may take a longer time to form the layer although the function as a coat layer remains unchanged, which may lower the productivity. Furthermore, if the thickness of the buffer layer 12 is less than 10 nm or more than 500 nm, it is difficult to control the lattice constant so as to satisfy the relationship represented by the aforementioned formula (1).

In addition, the thickness of the buffer layer 12 is preferably within a range from 20 to 100 nm.

In the present embodiment, the composition of the buffer layer 12 is preferably AlN.

In general, an Al-containing composition is preferred as the composition of the buffer layer 12 laminated on the substrate, and any Group III nitride material represented by the general formula $Al_XGa_{1-X}N$ ($1 \geq X \geq 0$) may be used. Furthermore, it is possible to use the composition of the buffer layer which contains As or P as a group V element. Among them, when the composition of the buffer layer contains Al, GaAlN is preferred. In such a case, the composition preferably contains Al at 50% or more. In addition, as described above, it is most preferred that the composition of the buffer layer 12 is made of AlN.

Furthermore, as the material for forming the buffer layer 12, any material having the same crystal structure as that of the Group III nitride semiconductor may be used, although materials having a lattice length close to that of a Group III nitride semiconductor for forming the ground layer, which will be described later, are preferred, and in particular nitrides of Group IIIa elements in the periodic table are suitable.

The buffer layer 12 is needed to cover 60% or more of the surface 11a of the substrate 11, preferably 80% or more, and more preferably 90%, in terms of the function as a coating layer of the substrate 11. Furthermore, the buffer layer 12 is most preferably formed so as to cover 100% of the surface 11a, i.e. to cover the surface 11a of the substrate 11 without any void. When the space where the buffer layer 12 covers the surface 11a of the substrate 11 is reduced, the substrate 11 is largely exposed, and therefore, does not function as a coating layer. As a result, a reaction may occur between the substrate and the semiconductor material that grows the Group III nitride semiconductor crystal, and there is a problem that the flatness of the ground layer 13 formed on the buffer layer 12 may deteriorate, which is described below.

[Lattice Constant]

In the present embodiment, the lattice constant of a-axis of the buffer layer 12 is preferably smaller than the lattice constant of a-axis of AlN in a bulk state. Moreover, in the semiconductor device of the present embodiment, the lattice constants of the buffer layer 12 preferably satisfy the above relationship as well as the relationship represented by the formula (1) (see the regions E1 and E2 in the graph of FIG. 6).

$$(c_0-c)/(a_0-a) \geq -1.4 \qquad (1)$$

In the formula (1), $c_0$ represents the lattice constant of c-axis of a bulky AlN, c represents the lattice constant of c-axis of the buffer layer, $a_0$ represents the lattice constant a-axis of bulky AlN, and a represents the lattice constant of a-axis of the buffer layer.

The bulk state described in the present invention does not mean the state where extraneous stress is applied but the state of a single crystal or an aggregate of crystals with a size in which the effects of the surface and the interface can be ignored. Moreover, the aforementioned crystal is made of a single composition. The lattice constants of AlN in a bulk state are 3.111 Å for a-axis and 4.980 Å for c-axis (Reference: I. Akasaki and H. Amano et al., Jpn. J. Appl. Phys. 36 (1997) 5393-5408).

In the present embodiment, the lattice constants of the buffer layer 12 are adjusted within the aforementioned range, and the buffer layer 12 is formed under the condition where the lattice constant of a-axis thereof is close to that of sapphire rather than AlN in a bulk state. Thus, it is possible to obtain the buffer layer 12 which is made of AlN, has a few of crystal defects, and has the lattice constant matching the lattice constant of a-axis of sapphire. When the ground layer 13 made of GaN described below is laminated on the buffer layer 12, for example, the orientation information of the single-crystalline substrate 11 made of sapphire is transferred to the ground layer 13. Thus, it is possible to obtain the ground layer 13 of the crystal with the excellent (0002) plane and (10-10) plane.

Figure 6:
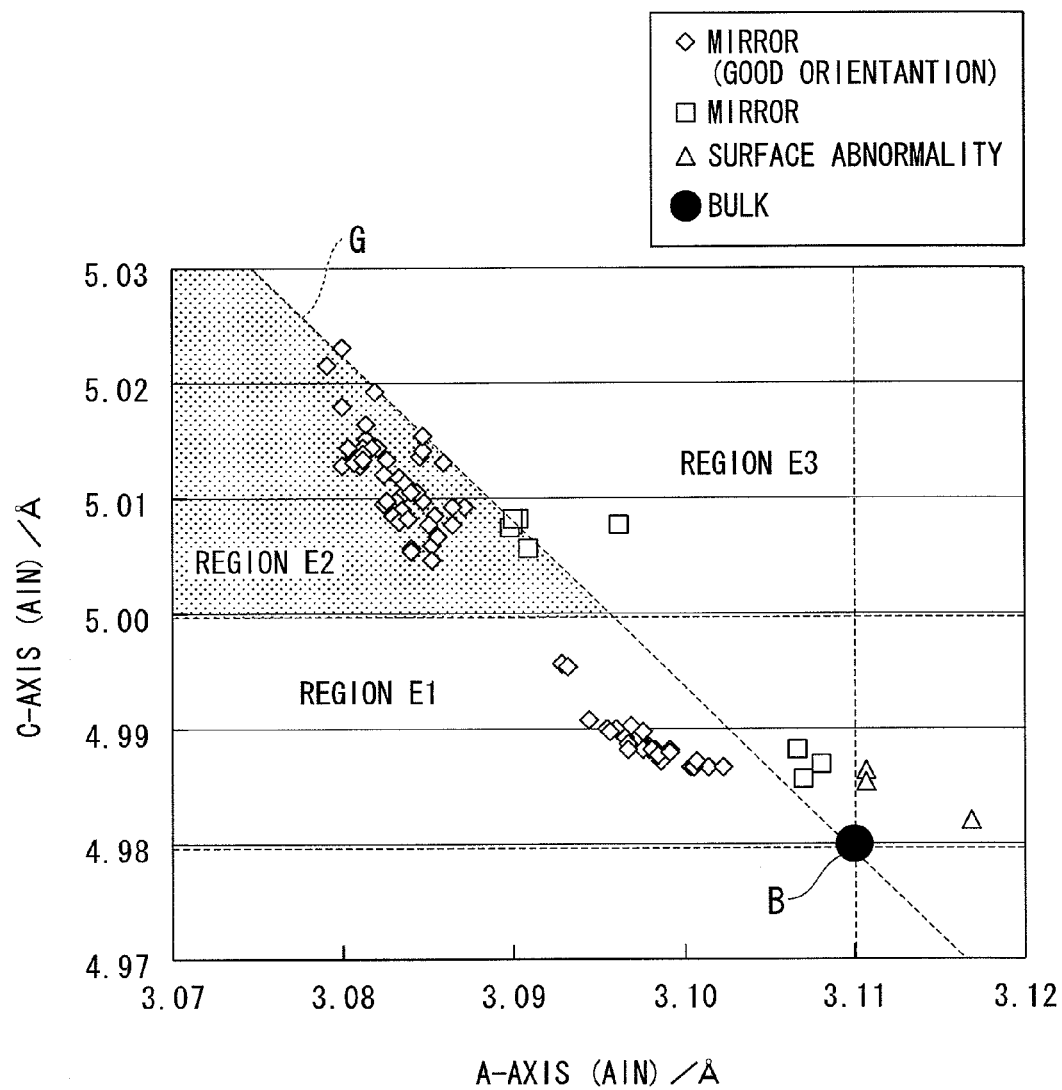
FIG. 6 is a schematic diagram for explaining an example of the Group III nitride semiconductor device according to the present invention, and is a graph showing a relationship of the lattice constant of the buffer layer made of AlN.

Moreover, the lattice constant of c-axis of the buffer layer 12 is preferably more than the lattice constant of c-axis of AlN in a bulk state, i.e. 4.980 Å, and more preferably 5 Å or more (see the region E2 in FIG. 6).

A lattice constant is represented by a length of a crystal axis or an angle between axes. In the case of the crystal having a hexagonal structure such as the buffer layer 12 of the present embodiment, a lattice constants are represented by a length of a-axis (Å) and a length of c-axis (Å) (a-axis≠c-axis in the case of hexagon).

In order to improve the crystallinity of a Group III nitride semiconductor device, the present inventors have intensively studied the relationship between the lattice constant of the buffer layer formed on the substrate 11 made of sapphire and the crystallinity of the ground layer which is made of a Group III nitride semiconductor and formed thereon. Then the following relationship was found.

FIG. 6 is the graph showing the relationship between the length of a-axis and the length of c-axis of the buffer layer 12 which was formed on the sapphire substrate using the reactive sputtering method and AlN. In other words, FIG. 6 is the graph showing the relationship between the lattice constants of a-axis and c-axis. In the graph of FIG. 6, the broken line represented by the symbol G is the straight line that shows the properties in the case where the formula: $\{(c_0-c)/(a_0-a)\}=-1.4$ is satisfied in the aforementioned formula (1). Moreover, in the graph of FIG. 6, the point represented by the symbol B shows the lattice constants (a-axis and c-axis) of AlN in a bulk state, and the straight line G passes through the B point.

Figure 7:
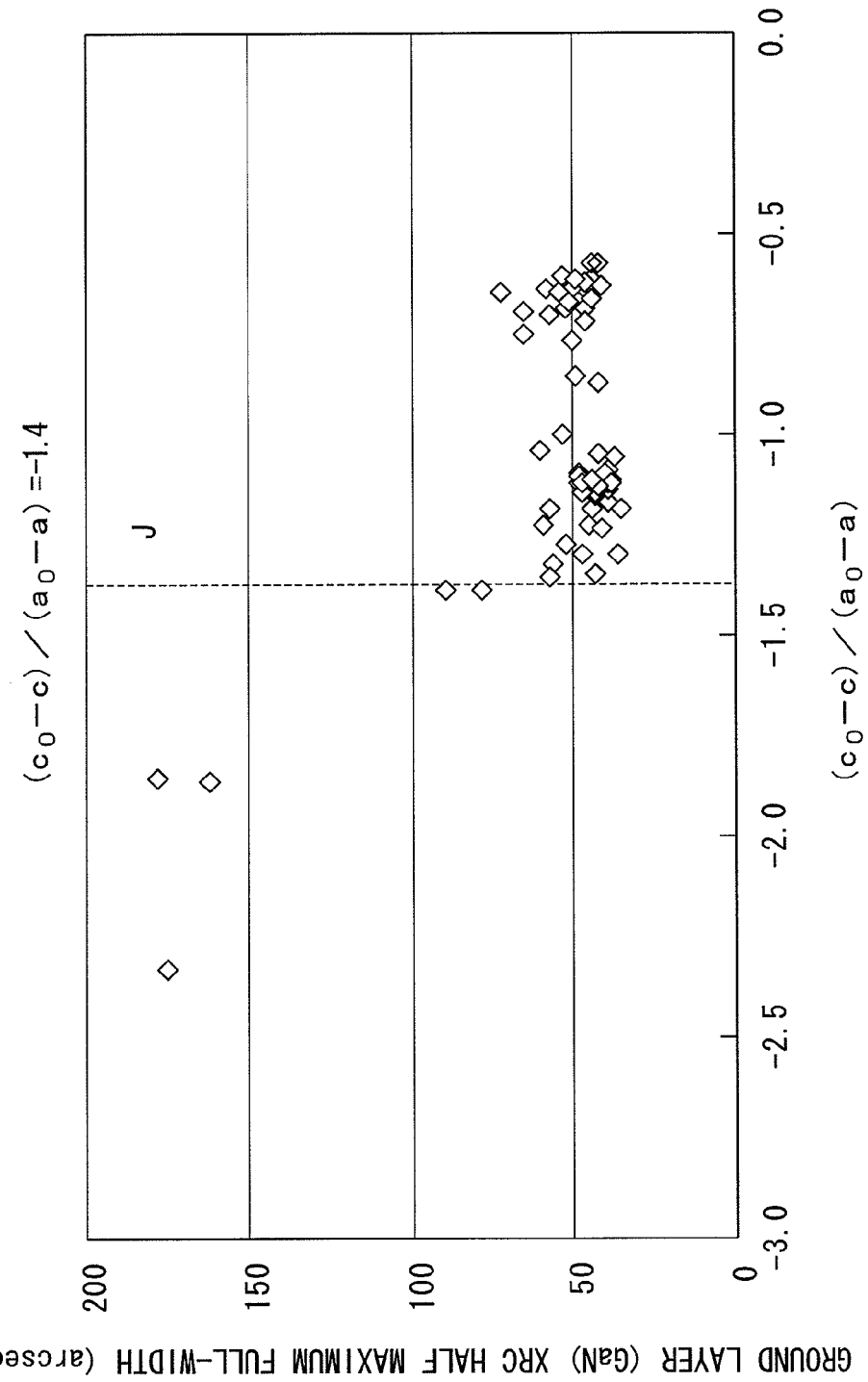
FIG. 7 is a schematic diagram for explaining an example of the Group III nitride semiconductor device according to the present invention, and is a graph showing a relationship between the value represented by the formula: $(c_0-c)/(a_0-a)$, which is a barometer of the lattice constant of the buffer layer made of AlN, and the half maximum full-width of X-ray rocking curve of a (0002) plane of the ground layer made of GaN.

FIG. 7 is the graph showing the relationship between the value represented by the formula: $(c_0-c)/(a_0-a)$ for the buffer layer made of AlN, which is the left-hand member of the aforementioned formula (1), and the half maximum full-width of XRC (X-ray rocking curve) of a (0002) plane of the GaN layer (ground layer) formed thereon. In the graph of FIG. 7 the broken line of the symbol J is the straight line that shows the formula: $\{(c_0-c)/(a_0-a)\}=-1.4$ in the aforementioned formula (1).

In the case of a Group III nitride semiconductor such as GaN, the half maximum full-width in a XRC spectrum of a (0002) plane acts as the barometer for crystal flatness (mosaicity), and the half maximum full-width of XRC spectrum of a (10-10) plane is the barometer for dislocation density (twist).

As shown in the graph of FIG. 6, in the case where the lattice constant of a-axis of the buffer layer 12 made of AlN is smaller than the lattice constant of a-axis of AlN in a bulk state, the GaN layer (ground layer) formed on the buffer layer mainly becomes the crystal whose surface is a mirror-like plane (see the plots represented by the □ symbol and ◇ symbol in the graph of FIG. 6). Moreover, as shown in the graph of FIG. 6, in the case where the lattice constants of the buffer layer 12 further satisfy the relationship represented by the aforementioned formula (1), the orientation of the (0002) plane of the GaN layer (ground layer) formed on the buffer layer becomes very good (see the regions E1 and E2 on the left side of the broken line G in the graph of FIG. 6).

Moreover, as shown in the graph of FIG. 7, in the case where the lattice constants of the buffer layer 12 satisfy the relationship represented by the aforementioned formula (1), the half maximum full-width of XRC of the (0002) plane of the GaN layer (ground layer) formed on the buffer layer becomes the small value and all of the values are 100 arcsec or less (see the regions on the right side of the broken line J in the graph of FIG. 7). Thus, it is found that, in the case where the lattice constants of the buffer layer satisfy the relationship represented by the aforementioned formula (1), the crystallinity of GaN formed on the buffer layer becomes good.

In contrast, in the case where the lattice constant of a-axis of the buffer layer 12 is larger than the lattice constant of a-axis of AlN in a bulk state, the GaN layer formed on the buffer layer has the surface defects such as the generation of cracks and an opaque surface, and it is found that good crystal cannot be obtained (see the plots represented by the Δ symbol in the graph of FIG. 6).

Figure 8:
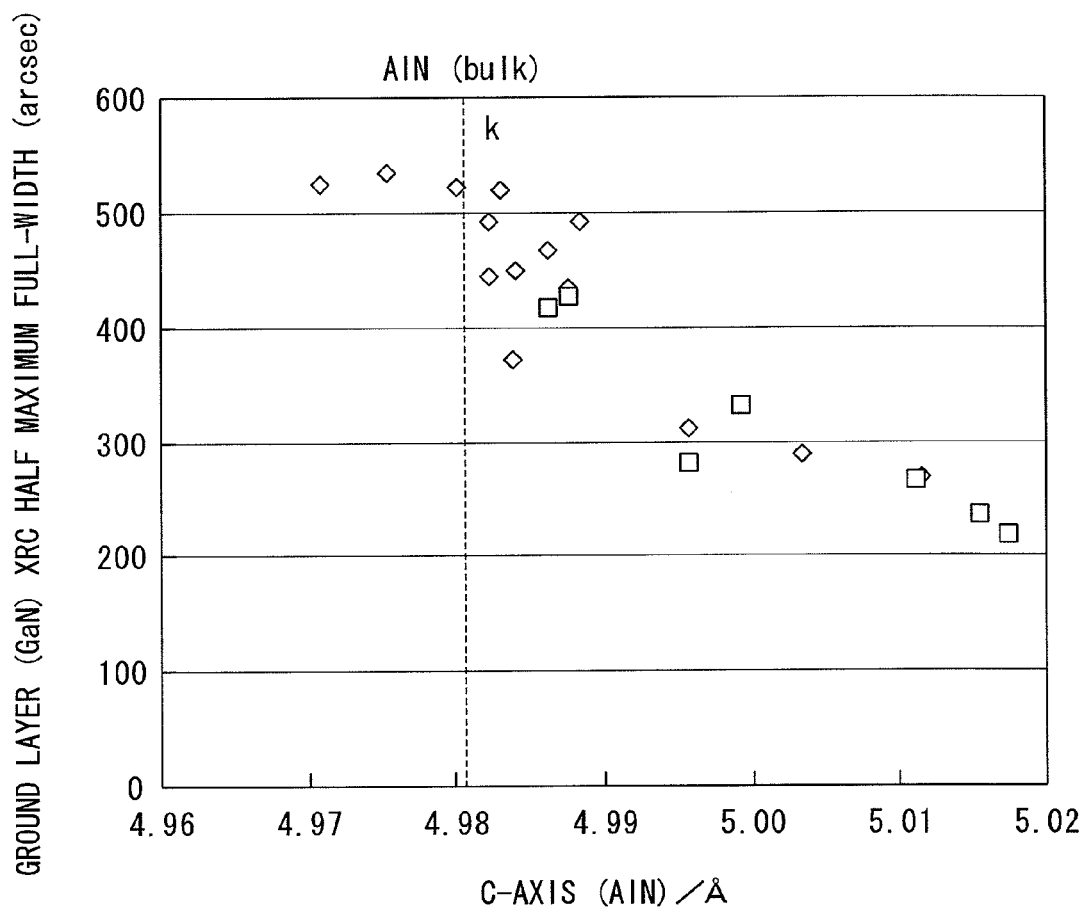
FIG. 8 is a schematic diagram for explaining an example of the Group III nitride semiconductor device according to the present invention, and is a graph showing a relationship between the lattice constant of the buffer layer made of AlN and the half maximum full-width of X-ray rocking curve of a (10-10) plane of the ground layer made of GaN.

FIG. 8 is the graph showing the relationship between the length of c-axis in the lattice constants of the buffer layer made of AlN and the half maximum full-width of XRC (X-ray rocking curve) of the (10-10) plane of the GaN layer (ground layer) formed on the buffer layer. In the graph of FIG. 8, the broken line of symbol k represents the lattice constant of the bulky AlN. As shown in the graph of FIG. 8, in the case where the lattice constant of the buffer layer is larger than 4.982 Å (c-axis) of AlN in a bulk state, which is represented by the broken line of the symbol k, it is found that the half maximum full-width of XRC of the (10-10) plane of the GaN layer formed on the buffer layer becomes small. Thus, it can be considered that, in the case where the lattice constant (c-axis) of the buffer layer is adjusted to be larger than that of AlN in a bulk state, the crystallinity of the GaN layer formed on the buffer layer is improved.

Furthermore, in the case where the lattice constant of c-axis of the buffer layer is set to be 5 Å or more, the half maximum full-width of XRC of the (10-10) plane of the ground layer, which is made of GaN and formed on the buffer layer, is 300 arcsec or less, and the crystallinity of the layer becomes good.

Thus, in the case where the crystallinity of the GaN layer (ground layer) is good, it is clear that this good crystallinity contributes the crystallinity of the respective layers of the n-type semiconductor layer, the light-emitting layer, and the p-type semiconductor layer which are made of the Group III nitride semiconductor (GaN) and formed on the ground layer.

The following explanation can be considered as the reason why the surface flatness and the crystallinity of the ground layer that is made of GaN and formed on the buffer layer in the case where the lattice constants of the buffer layer are within the aforementioned range.

Because the buffer layer made of AlN grows along c-axis on the substrate, the matching between the lattice constant of a-axis of AlN and the lattice constant of the substrate is important. The lattice constant of a-axis of the sapphire substrate is smaller than that of AlN, which cause the lattice mismatching. This lattice mismatching produce the state where the many crystal defects exist in the buffer layer made of AlN. In contrast, the film formation conditions of the buffer layer made of AlN are appropriately controlled in the present invention, and therefore, it is possible to form the buffer layer (AlN) whose lattice constant is smaller than the lattice constant of a-axis of AlN in a bulk state and matches the lattice constant of sapphire. The buffer layer made of AlN has a few of crystal defects, and is the film with good orientation. Thus, the ground layer that is made of GaN and formed on the buffer layer becomes the crystal whose surface is a mirror-like plane in a good state.

Moreover, in the case where the lattice constant of a-axis of the buffer layer made of AlN is set to be small so as to match that of sapphire constituting the substrate, the crystal is elongated along the direction of c-axis so as to relax the stress applied to the crystal, and therefore, the lattice constant of c-axis increases. When the stress within the AlN crystal is too large, the uneven distortion occurs within the crystal. The lattice constants of the buffer layer 12 made of AlN are defined within the aforementioned range in the present invention. Therefore, the stress within the AlN crystal becomes appropriate, and the lattice is evenly transformed. Thus, in the ground layer 13 that is made of GaN and formed on the buffer layer 12, the half maximum full-width of XRC of the (0002) plane, which shows the crystallinity along the direction of c-axis, becomes small, and the crystal whose surface has good flatness is obtained.

Moreover, when a stress is applied into the AlN crystal, this stress may be relaxed by generating crystal defects within the crystal. In the case where the lattice constant of c-axis of the buffer layer made of AlN is larger than the lattice constant of c-axis of AlN in a bulk state, only a few of the crystal defects are generated within AlN. Therefore, the half maximum full-width of XRC of the (10-10) plane, which is the barometer for the dislocation density of the GaN (ground layer 13) laminated on the buffer layer, becomes small. Thus, in the case where the lattice constant of c-axis of the buffer layer 12 is 5 Å or more, the crystallinity of the ground layer 13 becomes good.

As described above, when the lattice constants of the buffer layer 12 have the relationship that is included in the aforementioned regions E1 and E2, the buffer layer 12 is well oriented, and therefore, the good surface flatness and crystallinity of the GaN layer (ground layer) formed on the buffer layer are obtained.

In contrast, while there is the detailed description in the following Examples, in the case where the relationship of the lattice constants is included in the right-hand side of the straight line G in the graph of FIG. 6, i.e. in the side where the lattice constant of a-axis is large, it was found that the orientation of the GaN layer (ground layer) formed on the buffer layer deteriorates. Moreover, in the case where the relationship of the lattice constants is included in the right-hand side of the straight line G in the graph of FIG. 6 and the lattice constant of a-axis of the buffer layer (AlN) is larger than the lattice constant (3.11 Å) of a-axis of AlN in a bulk state, it was found that the surface flatness of the GaN layer (ground layer) formed on the buffer layer deteriorates.

As described above, a conventional buffer layer whose lattice constants do not satisfy the relationship defined in the present invention has the problems that the film is obtained in which the surface flatness and crystallinity of the GaN layer (ground layer) formed on the buffer layer deteriorates.

In contrast, in the Group III nitride semiconductor of the present embodiment, the lattice constants of the buffer layer 12 are controlled to satisfy the aforementioned relationship. Therefore, the lattice matching between the buffer layer 12 made of AlN and the substrate 11 made of sapphire is improved, and the buffer layer 12 becomes the layer with good orientation. The ground layer 13 is formed on the aforementioned buffer layer 12 and made of the Group III nitride semiconductor (GaN). Therefore, the ground layer 13 becomes the layer with good crystallinity, and it is possible to obtain the Group III nitride semiconductor device with good device properties. Moreover, when an LED structure is formed using the Group III nitride semiconductor device with the aforementioned buffer layer 12, it is possible to realize the Group III nitride semiconductor light-emitting device with good light-emitting properties.

[Semiconductor Layer]

As shown in FIG. 1, in the laminated semiconductor 10 of the present embodiment, the ground layer 13 is formed which is formed on the aforementioned buffer layer 12 and made of a Group III nitride semiconductor. Moreover, the n-type semiconductor layer 14, the light-emitting layer 15, and the p-type semiconductor layer 16, which are made of a Group III nitride semiconductor, are sequentially laminated on the ground layer 13 to form the semiconductor layer 20.

As the Group III nitride semiconductor, a variety of gallium nitride-based compound semiconductors such as those represented by the general formula $Al_X Ga_Y In_Z N_{1-A} M_A$ ($0 \le X \le 1$, $0 \le Y \le 1$, $0 \le Z \le 1$, and $X+Y+Z=1$. The symbol M represents a Group V element other than nitrogen (N), and $0 \le A < 1$) are known. In the present invention, any gallium nitride-based compound semiconductor represented by the general formula $Al_X Ga_Y In_Z N_{1-A} M_A$ ($0 \le X \le 1$, $0 \le Y \le 1$, $0 \le Z \le 1$, and $X+Y+Z=1$. The symbol M represents a Group V element other than nitrogen (N), and $0 \le A < 1$), including these known gallium nitride-based compound semiconductors, may be employed without any limitations.

The gallium nitride-based compound semiconductor may contain any other Group III element other than Al, Ga, and In, and may also contain, if necessary, an element such as Ge, Si, Mg, Ca, Zn, Be, P, and As. Furthermore, in some cases, such a gallium nitride-based compound semiconductor contains not only intentionally added elements, but also impurities inevitably contained depending on the film formation conditions, and the like, and trace amounts of impurities contained in raw materials and reaction tube materials.

[Ground Layer]

The ground layer 13 of the present embodiment is made of a Group III nitride semiconductor as described above, and is formed by laminating on the buffer layer 12 by a conventionally known MOCVD method.

It is not always necessary for the material of the ground layer 13 to be the same as that of the buffer layer 12 formed on the substrate 11, and different materials may be used; however, the ground layer 13 is preferably composed of an $Al_yGa_{1-y}N$ layer ($0 \leq y \leq 1$, preferably $0 \leq y \leq 0.5$, and more preferably $0 \leq y \leq 0.1$). Moreover, as the material used for the ground layer 13, a Ga-containing Group III nitride compound, i.e. a GaN-based compound semiconductor, is preferably used. In particular, AlGaN or GaN can be suitably used.

In addition, if the buffer layer 12 is formed into a columnar crystal aggregate made of AlN, it is necessary to loop dislocations by means of migration so that the ground layer 13 will not directly take over the crystallinity of the buffer layer 12. As such a material, the aforementioned GaN-based compound semiconductors including Ga can be enumerated. In particular, AlGaN or GaN is suitable.

The thickness of the ground layer 13 is preferably set within a range of 0.1 to 8 μm in terms of providing a ground layer having excellent crystallinity, and more preferably a range of 0.1 to 2 μm in terms of reduction of the processing time required for the film formation and improvement of the productivity.

As required, the ground layer 13 may be doped with an n-type impurity within a range of $1 \times 10^{17}$ to $1 \times 10^{19}/cm^3$, or undoped $1 \times 10^{17}/cm^3$), although it is preferably undoped in terms of maintenance of excellent crystallinity.

If the substrate 11 is electrically conductive, electrodes can be formed on and below the light-emitting device by doping a dopant into the ground layer 13 to make it electrically conductive. On the other hand, if an insulating material is used for the substrate 11, a chip structure is taken in which a positive electrode and a negative electrode are both disposed on the same surface of the light-emitting device. Hence, the ground layer 13 is preferably an undoped crystal for better crystallinity. The type of the n-type impurity is not particularly limited. Examples thereof include Si, Ge, and Sn, and preferably Si and Ge.

In the ground layer 13 of the present embodiment, the half maximum full-width of X-ray rocking curve (XRC) of the (0002) plane is preferably 100 arcsec or less. If the half maximum full-width of XRC of the (0002) plane is within the above range, the ground layer 13 can be formed as a layer having good crystallinity, and also it is possible to improve the crystallinity of the respective layers of the n-type semiconductor layer 14, the light-emitting layer 15, and the p-type light-emitting layer 16 which are laminated on the ground layer 13. If the half maximum full-width of XRC of the (0002) plane of the ground layer 13 exceeds 100 arcsec, a layer with poor crystallinity is formed, and the surface troubles such as opaque and a rough surface occur. As a result, the crystallinity of the respective layers formed thereon deteriorates.

In the ground layer 13 of the present embodiment, the half maximum full-width of XRC of the (10-10) plane is preferably 300 arcsec or less. If the half maximum full-width of XRC of the (10-10) plane is within the above range, the ground layer 13 can be formed as a layer having very good crystallinity, and also it is possible to improve the crystallinity of the respective layers which are laminated on the ground layer.

In the present embodiment, the lattice constants of the buffer layer 12 satisfy the aforementioned relationship, and the ground layer 13 is formed on the buffer layer 12. For this reason, the ground layer 13 with good crystallinity is obtained. In addition, the crystallinity of the respective layers, which are formed on the ground layer and is made of the Group III nitride semiconductor, is improved.

[N-Type Semiconductor Layer]

The n-type semiconductor layer 14 of the present embodiment is formed on the ground layer 13, and is comprised of the n-type contact layer 14a and the n-type clad layer 14b. In addition, the aforementioned ground layer 13 may also function as the n-type contact layer.

[N-Type Contact Layer]

The n-type contact layer 14a of the present embodiment is made of a Group III nitride semiconductor, and can be formed by laminating on the ground layer 13 by an MOCVD method or a sputtering method.

The n-type contact layer 14a is preferably composed of an $Al_xGa_{1-x}N$ layer ($0 \leq x \leq 1$, preferably $0 \leq x \leq 0.5$, and more preferably $0 \leq x \leq 0.1$), similarly to the aforementioned ground layer 13. In addition, an n-type impurity is preferably doped therein. The n-type impurity is preferably contained at a concentration of $1 \times 10^{17}$ to $1 \times 10^{19}/cm^3$, and preferably $1 \times 10^{18}$ to $1 \times 10^{19}/cm^3$, in terms of maintenance of excellent ohmic contact with the negative electrode, prevention against cracking, and maintenance of excellent crystallinity. The type of the n-type impurity is not particularly limited. Examples thereof include Si, Ge, and Sn, and preferably Si and Ge. The growth temperature of the n-type contact layer 14a can be similar to that of the ground layer 13.

The gallium nitride-based compound semiconductor constituting the n-type contact layer 14a preferably has the same composition as the ground layer 13. In addition it is preferable that the total film thickness of these layers be set within a range of 0.1 to 20 μm, preferably 0.5 to 15 and more preferably 1 to 12 μm. If the total film thickness is within such a range, the crystallinity of the respective layers can be kept excellent.

[N-Type Clad Layer]

The n-type clad layer 14b is preferably provided between the abovementioned n-type contact layer 14a and the light-emitting layer 15 described in detail below. By providing the n-type clad layer 14b, non-flatness occurring in the outermost surface of the n-type contact layer 14a can be improved. The n-type clad layer 14b can be made of AlGaN, GaN, GaInN, or the like, through an MOCVD method or the like. In addition, a heterojunction of these structures or a superlattice structure having a plurality of laminated layers can be used. In the case of GaInN, it is needless to say that the band gap of the n-type clad layer 14b made of GaInN is desirably greater than that of the GaInN of the light-emitting layer 15.

The thickness of the n-type clad layer 14b is not particularly limited, although it is preferably within a range of 5 to 500 nm, and more preferably 5 to 100 nm.

Moreover, the concentration of an n-type dopant in the n-type clad layer 14b is preferably within a range of $1 \times 10^{17}$ to $1 \times 10^{20}/cm^3$, and more preferably $1 \times 10^{18}$ to $1 \times 10^{19}/cm^3$. The dopant concentration is preferably within this range in terms of maintenance of excellent crystallinity and reduction of the operating voltage of the light-emitting device.

When being a layer containing a superlattice structure, while a detailed diagrammatic representation is not shown, the n-type clad layer 14b may contain the structure obtained by laminating the n-side first layer, which has a thickness of 100 Å or less and is made of the group III nitride semiconductor, and the n-side second layer which has a different composition from that of the n-side first layer, has a thickness of 100 Å or less, and is made of the group III nitride semiconductor. In addition, the n-type clad layer 14b may have the structure obtained by alternately and repeatedly laminating the n-side first layer and the n-side second layer. Furthermore, it is preferred that any of the n-side first layer and the n-side second layer contact the light-emitting layer 15.

The compositions of the aforementioned n-side first layer and n-side second layer may be an Al-containing AlGaN-based composition (may be abbreviated simply as AlGaN), a In-containing GaInN-based (may be abbreviated simply as GaInN), or GaN. In addition, the n-side first layer and n-side second layer may have the alternate structure of GaInN/GaN, the alternate structure of AlGaN/GaN, the alternate structure of GaInN/AlGaN, the alternate structure of GaInN/GaInN which have different compositions (the phrase "different composition" in the present invention refers to the difference of an element composition. Hereunder, the same applies), or the alternate structure of AlGaN/AlGaN which have different compositions. It is preferable in the present invention that the n-side first layer and n-side second layer have the alternate structure of GaInN/GaN or GaInN/GaInN which have different compositions.

The respective superlattice structures of the n-side first layer and n-side second layer preferably have a thickness of 60 Å or less, more preferably 40 Å or less, and most preferably within a range from 10 Å to 40 Å. If the n-side first layer and n-side second layer that form a superlattice layer have a thickness exceeding 100 Å, crystal defects are likely to occur, and it is not favorable.

The aforementioned n-side first layer and n-side second layer may have a doped structure or the combination of a doped structure and an undoped structure. As an impurity to be doped, any known dopant for the aforementioned material and composition can be used without any limitation. For example, Si is preferred as an impurity when the alternate structure of GaInN/GaN or the alternate structure of GaInN/GaInN which have different compositions are used as the n-type clad layer. In addition, the aforementioned n-side superlattice multilayer film may be formed by appropriately controlling the on-off action of doping even when the compositions represented by GaInN, AlGaN, and GaN are the same.

[Light-Emitting Layer]

The light emitting layer 15 is a layer which is laminated on the n-type semiconductor layer 14, as well as being a layer on which the p-type semiconductor layer 16 is laminated. The light emitting layer 15 can be formed by a conventionally known MOCVD method. In addition, as shown in FIG. 1, the light emitting layer 15 has a structure in which each of the barrier layers 15a made of a gallium nitride-based compound semiconductor, and well layers 15b made of an indium-containing gallium nitride-based compound semiconductor is laminated alternately and repeatedly. In the illustrated example, the barrier layers 15a are arranged at both sides of the n-type semiconductor layer 14 and the p-type semiconductor layer 16.

For the well layer 15b, for example, a gallium nitride indium such as $Ga_{1-s}In_sN$ (0<s<0.4) can be used as the indium-containing gallium nitride-based compound semiconductor.

In addition, as the barrier layer 15a, for example, a gallium nitride-based compound semiconductor such as $Al_cGa_{1-c}N$ (0≤c<0.3) whose band gap energy is greater than that of the well layer 15b made of an indium-containing gallium nitride-based compound semiconductor is preferably used.

The total thickness of the light-emitting layer 15 is not particularly limited. For example, the thickness of the light-emitting layer 15 is preferably within a range of 1 to 500 nm, and more preferably around 100 nm. The film thickness within the above range contributes to improvement of the light emission output.

[P-Type Semiconductor Layer]

The p-type semiconductor layer 16 is normally composed of a p-type clad layer 16a and a p-type contact layer 16b, and is formed through an MOCVD method or a reactive sputtering method. In addition, the p-type contact layer may also function as the p-type clad layer.

The p-type semiconductor layer 16 of the present embodiment is doped with a p-type impurity for controlling the conductivity to p-type. The type of the p-type impurity is not particularly limited, although Mg is preferably used. Moreover, similarly, Zn may also be used.

In addition, the total thickness of the p-type semiconductor layer 16 is not particularly limited, although it is preferably within a range of 0.05 to 1 μm.

[P-Type Clad Layer]

The p-type clad layer 16a is not particularly limited as long as the composition allows a greater band gap energy than that of the light-emitting layer 15, details of which will be described later, and carrier confinement in the light-emitting layer 15 can be achieved, although $Al_dGa_{1-d}N$ (0<d≤0.4, and preferably 0.1≤d≤0.3) is preferred. The p-type clad layer 16a is preferably composed of such AlGaN in terms of carrier confinement in the light-emitting layer 15.

The thickness of the p-clad layer 16a is not particularly limited, although it is preferably 1 to 400 nm and more preferably 5 to 100 nm.

The p-type dopant concentration, resulting from the addition of the p-type impurity into the p-type clad layer 16a, is preferably set within a range of $1×10^{18}$ to $5×10^{21}/cm^3$, and more preferably $1×10^{19}$ to $5×10^{20}/cm^3$. If the p-type dopant concentration is within the above range, an excellent p-type crystal can be obtained without lowering the crystallinity.

Also, the p-type cladding layer 16a of the present embodiment can contain a superlattice structure having a plurality of laminated layers in the same manner as the aforementioned the n-type cladding layer 14b. In those cases where the p-type cladding layer 16a incorporates a superlattice structure, although not shown in detail in the drawings, the layer may include a laminated structure composed of a p-side first layer made of a group-III nitride compound semiconductor having a film thickness of not more than 100 angstroms, and a p-side second layer having a different composition from the p-side first layer and made of a group-III nitride compound semiconductor having a film thickness of not more than 100 angstroms. Further, the p-type cladding layer 16a may also include a structure in which the p-side first layer and the p-side second layer are laminated repeatedly in an alternating arrangement.

The compositions of the aforementioned p-side first layer and p-side second layer may be different from each other, and can be any one of AlGaN, GaInN and GaN, for example. Further, the p-side first layer and p-side second layer may also be formed as a GaInN/GaN alternating structure, an AlGaN/GaN alternating structure, or a GaInN/AlGaN alternating structure. In the present invention, the compositions of the p-side first layer and the p-side second layer are preferably either a AlGaN/AlGaN structure, or an AlGaN/GaN alternating structure.

The superlattice layers of the p-side first layer and the p-side second layer are preferably not more than 60 angstroms in each case, are more preferably 40 angstroms or less, and are most preferably within a range from 10 to 40 angstroms. If the film thickness of the p-side first layer and p-side second layer that form the superlattice layer exceed 100 angstroms, then the layer tends to contain many crystal defects, which is undesirable.

The structures of the p-side first layer and the p-side second layer may be doped structures, or may be a combination of a doped structure and an undoped structure. As the doping impurity, any of the conventional impurities used for doping the above material compositions can be used without any particular limitations. For example, in those cases where a layer having an AlGaN/GaN alternating structure or an AlGaN/AlGaN alternating structure having a different composition for each layer is used as the p-type cladding layer, Mg is preferred as the impurity. Further, the aforementioned p-type superlattice multilayer film may be prepared with doping switched appropriately ON and OFF, even if the composition such as GaInN, AlGaN or GaN is the same.

[P-Type Contact Layer]

The p-type contact layer 16b is a gallium nitride-based compound semiconductor layer containing at least $Al_eGa_{1-e}N$ ($0 \leq e < 0.5$, preferably $0 \leq e \leq 0.2$, and more preferably $0 \leq e \leq 0.1$). The Al composition is preferably within the above range in terms of maintenance of excellent crystallinity and excellent ohmic contact with the p-ohmic electrode (refer to a transparent electrode 17 that will be described later).

The thickness of the p-type contact layer 16b is not particularly limited, although it is preferably 10 to 500 nm and more preferably 50 to 200 nm. The film thickness is preferably within this range in terms of light emission output.

In addition, the p-type dopant concentration, resulting from the addition of the p-type impurity into the p-type contact layer 16b, is preferably set within a range of $1 \times 10^{18}$ to $1 \times 10^{21}/cm^3$, and more preferably $5 \times 10^{19}$ to $5 \times 10^{20}/cm^3$, in terms of maintenance of excellent ohmic contact, prevention against cracking, and maintenance of excellent crystallinity.

As described above, the laminated semiconductor 10 of the present embodiment is comprised of the buffer layer 12 whose lattice constants satisfy the relationship represented by the aforementioned formula (1), and the ground layer 13 made of the Group III nitride semiconductor is formed on the buffer layer. Therefore, the Group III nitride semiconductor device with good device properties can be obtained. In addition, when the n-type semiconductor layer 14, the light-emitting layer 15, and the p-type semiconductor layer 16 are sequentially laminated on the ground layer 13 so as to form an LED structure, the respective layers obtain good crystallinity, and it is possible to realize the Group III nitride semiconductor light-emitting device with good light-emitting properties.

<Structure of Light-Emitting Diode (LED)>

Figure 2:
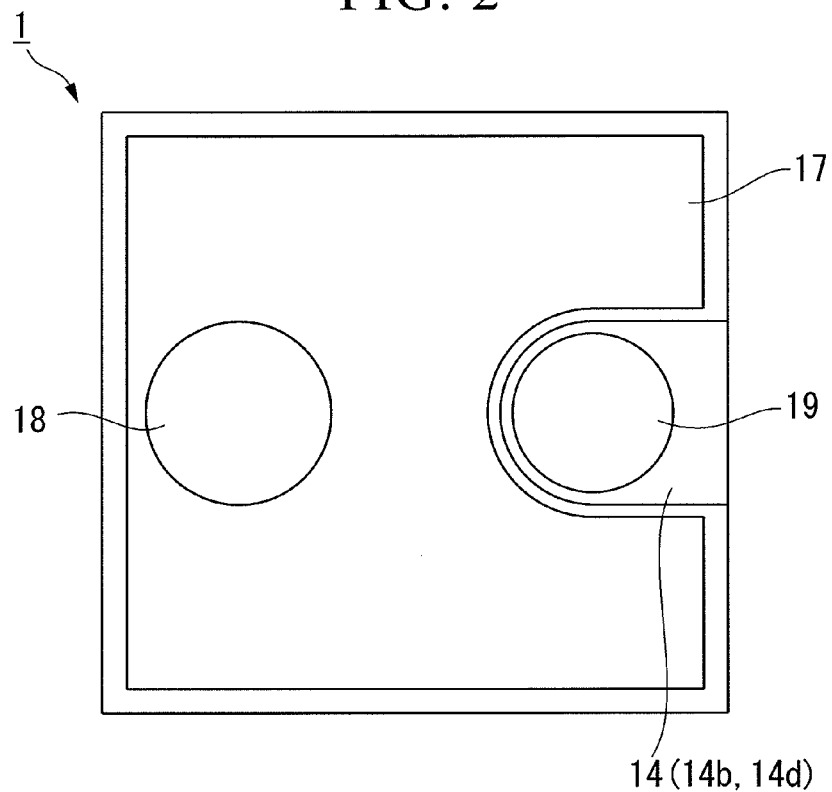
FIG. 2 is a schematic diagram for explaining an example of a Group III nitride semiconductor light-emitting device according to the present invention, showing a planer structure.
Figure 3:
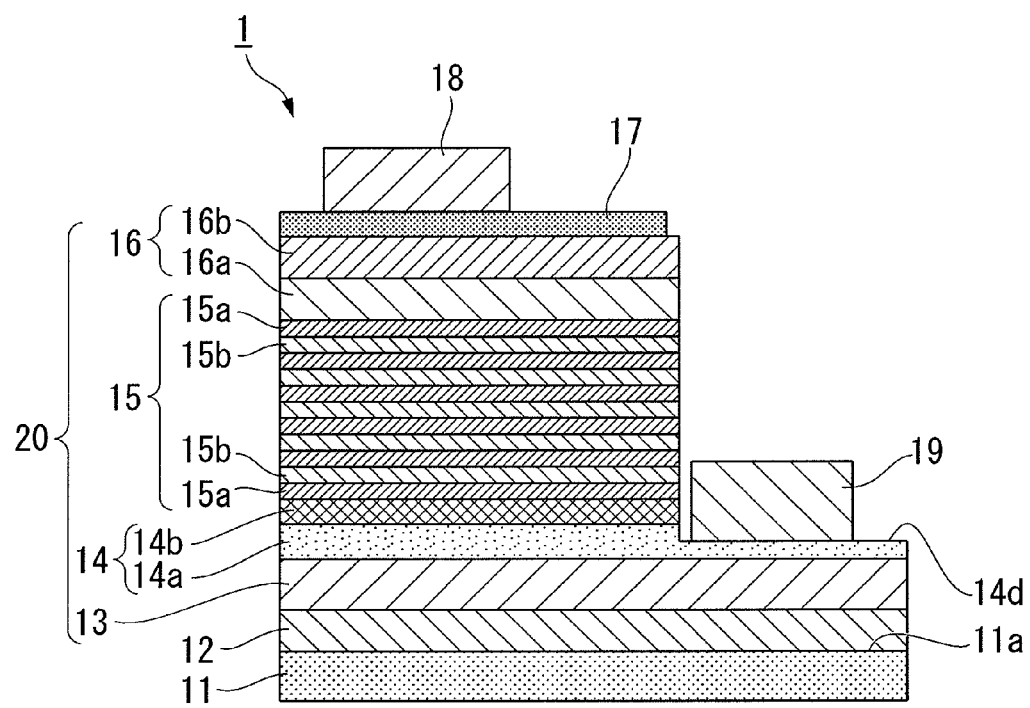
FIG. 3 is a schematic diagram for explaining an example of a Group III nitride semiconductor light-emitting device according to the present invention, showing a cross-sectional structure.

As shown in the examples illustrated by the planer diagram of FIG. 2 and the cross-sectional diagram of FIG. 3, the light-emitting diode (the Group III nitride semiconductor light-emitting device) 1 can be produced by forming the transparent positive electrode 17 on the p-type semiconductor layer 16 of the laminated semiconductor 10, the positive electrode bonding pad 18 on the transparent positive electrode, and the negative electrode 19 on the exposed area 14d formed on the n-type contact layer 14a of the n-type semiconductor layer 14.

[Transparent Positive Electrode]

The transparent positive electrode 17 is a transparent electrode formed on the p-type semiconductor layer 16 (p-type contact layer 16b) of the laminated semiconductor 10 mentioned above.

The material of the transparent positive electrode 17 is not particularly limited, and examples of the material include ITO ($In_2O_3$—$SnO_2$), AZO ($ZnO$—$Al_2O_3$), IZO ($In_2O_3$—$ZnO$), and GZO ($ZnO$—$Ga_2O_3$). The transparent positive electrode 17 can be formed by using these materials through a commonly used means which is well known in this technological field. In addition, the structure thereof may employ any structure including conventionally well known structures without any limitations.

Moreover, the transparent positive electrode 17 may be either formed to cover substantially all over the surface of the Mg-doped p-type semiconductor layer 16 or formed in a lattice shape or branching shape by having spaces.

[Positive Electrode Bonding Pad and Negative Electrode]

The positive electrode bonding pad 18 is an electrode formed on the abovementioned transparent positive electrode 17.

Examples of the material of the positive electrode 18 include Au, Al, Ni, Cu, and the like, and the various structures using these materials are well known. These well known materials and structures may be employed without any limitation.

The thickness of the positive electrode bonding pad 18 is preferably within a range of 100 to 1000 nm. Moreover, in terms of the characteristics of the bonding pad, the thickness is preferably larger since the bondability becomes higher. Therefore, the thickness of the positive electrode bonding pad 18 is more preferably 300 nm or more. Furthermore, the thickness is preferably 500 nm or less in terms of the production cost.

The negative electrode 19 is formed to be in contact with the n-type contact layer 14a of the n-type semiconductor layer 14, in the semiconductor layer in which the n-type semiconductor layer 14, the light-emitting layer 15, and the p-type semiconductor layer 16 have been sequentially laminated on the substrate 11. Therefore, for forming the negative electrode 19, the p-type semiconductor layer 16, the light-emitting layer 15, and the n-type semiconductor layer 14 are partially removed to thereby expose the exposed area 14d in the n-type contact layer 14a, on which the negative electrode 19 is formed.

As the negative electrode 19, negative electrodes of various compositions and structures are well known. These well known negative electrodes may be employed without any limitation, and can be provided through a commonly used means which is well known in this technical field.

As described above, according to the Group III nitride semiconductor device of the present embodiment, the buffer layer formed on the substrate 11 is made of AlN, and the lattice constant of a-axis of the buffer layer 12 is smaller than the lattice constant of a-axis of AlN in a bulk state. Therefore, it is possible to obtain the buffer layer 12 which has a highly uniform crystal and is well aligned. In addition, the crystallinity of the ground layer 13, which is formed on the buffer layer 12 and is made of a Group III nitride semiconductor, is improved. As a result, it is possible to obtain a Group III nitride semiconductor with good device properties.

In addition, the Group III nitride semiconductor light-emitting device 1 that has LED (Light-Emitting Diode) structure is obtained by further sequentially laminating the n-type semiconductor layer 14, the light-emitting layer 15, and the p-type semiconductor layer 16 on the ground layer 13, and therefore, has good light-emitting properties.

<Manufacturing Method>

The method for manufacturing a Group III nitride semiconductor device of the present invention, including: laminating at least the buffer layer 12 made of a Group III nitride compound on the substrate 11, wherein the buffer layer 12 is made of AlN under a condition where the lattice constant of a-axis of the buffer layer 12 is smaller than the lattice constant of a-axis of AlN in a bulk state. Moreover, it is preferred in the method for manufacturing a Group III nitride semiconductor device that the buffer layer 12 be formed under the condition where the lattice constants of the buffer layer 12 satisfy the relationship represented by a formula (1):

$$(c_0-c)/(a_0-a) \geq -1.4 \quad (1)$$

In the formula (1), $c_0$ represents the lattice constant of c-axis of a bulky AlN, c represents the lattice constant of c-axis of the buffer layer, $a_0$ represents the lattice constant a-axis of bulky AlN, and a represents the lattice constant of a-axis of the buffer layer.

In the manufacturing method of the present embodiment, upon formation of the laminated semiconductor 10 (the Group III nitride semiconductor device, the Group III nitride semiconductor light-emitting device) as shown in FIG. 1 by epitaxially growing a Group III nitride semiconductor crystal on the substrate 11, the buffer layer 12 whose lattice constants satisfy the relationship represented by the aforementioned formula (1) is firstly formed on the substrate 11, and then, the ground layer 13 is formed thereon. In the present embodiment, the n-type semiconductor layer 14, the light-emitting layer 15, and the p-type semiconductor layer 16 are further sequentially laminated on the ground layer 13, to thereby produce the Group III nitride semiconductor light-emitting device that has the LED structure (the semiconductor layer 20).

In the present embodiment, the buffer layer 12 is firstly formed by a reactive sputtering method, and the ground layer 13 is formed thereon by an MOCVD method, to thereby produce the Group III nitride semiconductor device. In the present embodiment, the n-type contact layer 14a that constitutes the n-type semiconductor layer 14 is formed on the ground layer 13 by a reactive sputtering method, the respective layers of the n-type clad layer 14b and the light-emitting layer 15 are formed thereon by an MOCVD method, and the p-type semiconductor layer 16 is formed by a sputtering method, to thereby produce the Group III nitride semiconductor light-emitting device that has the semiconductor layer 20 of the LED structure.

Hereunder is a detailed description of the manufacturing method of the Group III nitride semiconductor device (the Group III nitride semiconductor light-emitting device) of the present embodiment.

[Formation of Buffer Layer]

In the present embodiment, the buffer layer 12 is formed on the substrate 11 by using plasma to activate and react a Group V element-containing gas and a metal material. In the present example, the buffer layer 12 is formed by a reactive sputtering method. Furthermore, in the present embodiment, the buffer layer 12 is formed of AlN under the condition where the lattice constant of a-axis of the buffer layer 12 is smaller than the lattice constant of a-axis of AlN in a bulk state. In addition, the buffer layer 12 can be formed under the condition where the lattice constants satisfy the relationship represented by the following formula: $(c_0-c)/(a_0-a) \geq -1.4$ (in the formula, $c_0$ represents the lattice constant of c-axis of a bulky AlN, c represents the lattice constant of c-axis of the buffer layer, $a_0$ represents the lattice constant a-axis of bulky AlN, and a represents the lattice constant of a-axis of the buffer layer). In this manner, the lattice constants are controlled by the conditions for the formation of the buffer layer 12. In specific, the lattice constants can be controlled by appropriately setting the conditions such as an ultimate vacuum degree, an impurity reduction due to dummy discharge and a pretreatment of the substrate, a substrate temperature, and power (and bias). The conditions and processes, the details of which are described below, are used.

[Pretreatment of Substrate]

In the present embodiment, the substrate 11 is desirably subjected to a pretreatment using a method such as sputter-cleaning in a plasma process, after the substrate 11 had been introduced in a reactor (see a sputtering apparatus 40 illustrated in FIG. 5) and before the buffer layer 12 is formed. In specific, the surface can be conditioned by exposing the substrate 11 to plasma of Ar or $N_2$. For example, by sputter-cleaning in which the surface of the substrate 11 is treated with plasma of an Ar gas, an $N_2$ gas, or the like, organic materials and oxides adhered onto the surface of the substrate 11 can be removed. In this case, if an electrical voltage is applied between the substrate 11 and the chamber, plasma particles will act efficiently on the substrate 11. By applying such a pretreatment to the substrate 11, the buffer layer 12 can be formed all over the surface 11a of the substrate 11, which enables improvement of the crystallinity of a film made of a Group III nitride semiconductor to be formed thereon.

In addition, it is more preferable that the substrate 11 be subjected to a wet-type pretreatment before the pretreatment using the aforementioned sputter-cleaning is performed.

Furthermore, the pretreatment for the substrate 11 is preferably performed using the plasma treatment, which is performed in the atmosphere that mixes an ion component and a radical component containing no charge, such as the aforementioned sputter-cleaning.

For example, when an ion component, etc. is singularly supplied onto the substrate surface in order to remove the contamination, etc. from the substrate surface, the substrate surface gets damage due to the too strong energy, and there is the problem that the quality of the crystal grown on the substrate deteriorates.

In the present embodiment, the substrate 11 is subjected to a reactive species having appropriate energy by using the aforementioned plasma treatment, which is performed in the atmosphere that mixes an ion component and a radical component, as the pretreatment for the substrate 11. Therefore, it is possible to remove the contamination, etc. without providing damage onto the surface of the substrate 11. It can be considered as the mechanism to obtain the aforementioned effects that the damage onto the substrate surface is suppressed by using the plasma having a small proportion of an ion component and that the contamination can be effectively removed by subjecting the substrate surface to the plasma In the manufacturing method of the present embodiment, the contamination can be effectively removed by subjecting the surface of the substrate 11 to the aforementioned pretreatment. Therefore, the buffer layer 12 formed on the substrate 11 can be formed as a well aligned layer. In addition, because the contamination is effectively removed from the surface of the substrate 11, it is possible to easily control the buffer layer 12 formed thereon such that the lattice constants satisfy the aforementioned relationship.

[Film Formation Using a Reactive Sputtering Method]

In the present embodiment, after the pretreatment is performed on the surface of the substrate 11, an argon gas and a nitrogen-containing gas are introduced into the chamber 41 within the sputtering apparatus 40 (see FIG. 5), and the temperature of the substrate 11 is set at about 500° C. Then, the buffer layer 12 made of AlN is formed on the substrate 11 while applying a high frequency bias to the substrate 11 side, applying power to the side of the metal target 47 made by using a metal Al as a Group III metal raw material so as to generate plasma within the chamber 41, and keeping the pressure in the chamber 41 constant.

As the method for forming the buffer layer 12 on the substrate 11, for example, an MOCVD method, a pulsed laser deposition (PLD) method, a pulsed electron deposition (PED) method, and the like can be enumerated in addition to the reactive sputtering method. These methods may be appropriately selected for use, although the reactive sputtering method is a preferred method since it is most convenient and suitable for mass production.

(Sputtering Apparatus)

Figure 5:
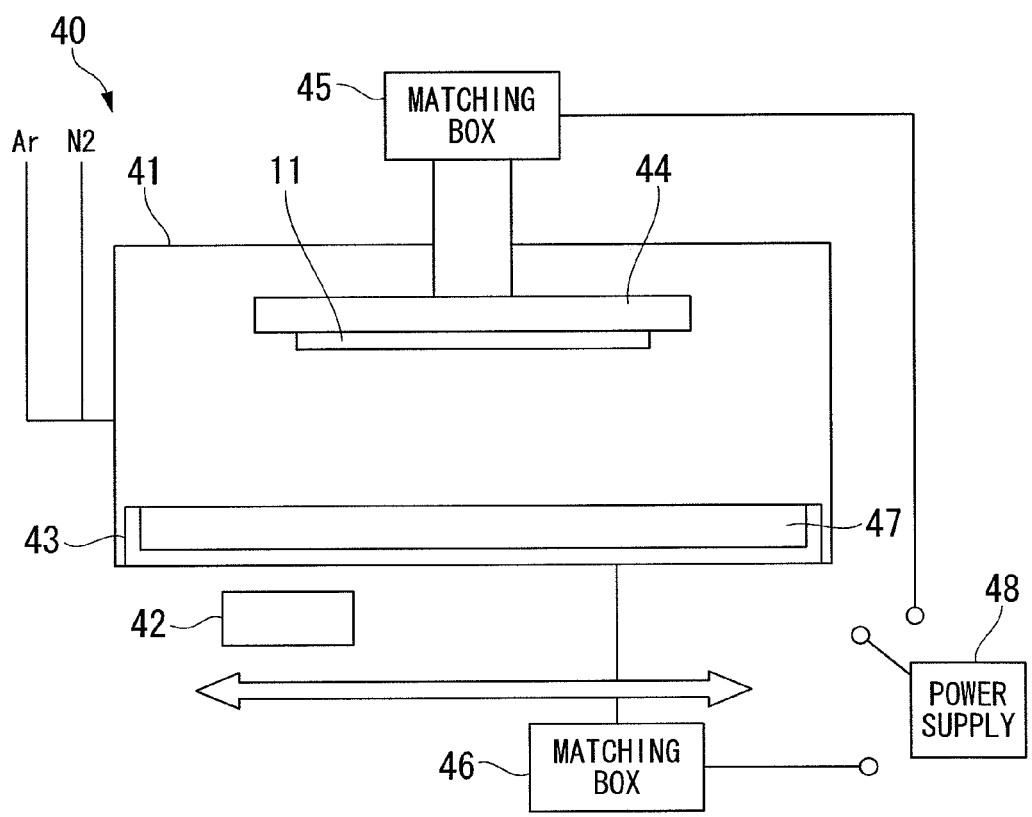
FIG. 5 is a schematic diagram for explaining an example of a method for manufacturing a Group III nitride semiconductor device (a Group III nitride semiconductor light-emitting device) according to the present invention, showing a structure of a sputtering apparatus in which a target is provided in a chamber.

In the sputtering apparatus 40 of the example shown in FIG. 5, the magnet 42 is provided underneath the metal target 47 (lower side of FIG. 5), and is swung underneath the metal target 47 by an unillustrated drive unit. A nitrogen gas and an argon gas are fed into the chamber 41, and the buffer layer is formed on the substrate 11 that is mounted on the heater 44. In this case, the magnet 42 is swung underneath the metal target 47 as described above. Therefore, the plasma that is confined within the chamber 41 can moves so as to uniformly form the buffer layer on the surface 11a of the substrate 11 as well as the side surfaces thereof.

Examples of the method by which the buffer layer is formed by a reactive sputtering method include an RF sputtering method and a DC sputtering method. When the film formation is performed using a reactive sputtering method and a nitrogen gas as a nitrogen-containing gas as in the manufacturing method of the invention, it is known that the nitrogen attaches onto the surface of the target (metal material) (see Mat. Res. Soc. Symp. Proc. Vol. 68, 357, 1986). In general, when sputtering is performed using a target of a metal material, a DC sputtering method is preferably used in terms of film formation efficiency. However, in a DC sputtering method that continuously discharges an electrical current, the target surface may be charged up (electrostatic charge) due to the attachment of nitrogen onto the target, and thus, the film formation rate may become unstable. Therefore, in the manufacturing method of the present invention, it is preferable to use a pulsed DC sputtering method that can provide pulsed bias among an RF sputtering method and a DC sputtering method. Also, it is preferable to use a sputtering apparatus that can operate using this pulsed DC sputtering method.

Moreover, for the formation of the buffer layer 12 by a reactive sputtering method, it is preferable to use a reactive sputtering method in which nitrogen is circulated in a reactor because crystallinity can be well kept by controlling reaction and that the good crystallinity can be stably reproduced. It is preferable to use the sputtering apparatus that can operate by the aforementioned reactive sputtering method.

Moreover, when a sputtering apparatus that operates by an RF sputtering method is used, it is preferable to move the position of a magnet in a target as a method of avoiding charge-up. A specific motion can be selected according to a sputtering apparatus to be used, and a magnet can be swung or rotated. The sputtering apparatus 40 exemplified in FIG. 5 has the structure in which the magnet 42 is provided underneath the target 47, and this magnet 42 can be rotated underneath the target 47.

Moreover, the technical method, in which plasma is confined within a magnetic field to improve efficiency, is generally used in a reactive sputtering method. In this case, the same method as for the aforementioned sputtering apparatus 40 is preferably used as a method to evenly use a target. That is, it is preferable to use the RF sputtering method in which a film formation is conducted while the position of the magnet 42 of cathode is moved in the target 47. A specific motion of the magnet in this case can be selected according to a sputtering apparatus to be used, and for example, the magnet can be swung or rotated.

Moreover, the buffer layer 12 is preferably formed to cover the lateral sides of the substrate 11, and more preferably formed to cover the lateral sides and the back side of the substrate 11. As described above, the buffer layer 12 is preferably formed to cover at least 90% of the surface of the substrate 11.

However, when the buffer layer is formed using a conventional sputtering apparatus and film formation method, a film formation process needs to be conducted from about 6 times to 8 times, and the process requires long term. As a film formation method other than this, there is a method which set the substrate in the chamber without holding, to thereby conduct the film formation on the whole surface of substrate. However, in the case where the substrate needs to be heated, the apparatus may be so complicated. Therefore, by using a sputtering apparatus that can swing or rotate the substrate, it is possible to conduct the film formation while changing the position of the substrate along the sputtering direction of a film formation material. By using the aforementioned sputtering apparatus and film formation method, it is possible to conduct the film formation on the surface and lateral sides of the substrate in one step. In addition, by conducting the film formation on the back side of the substrate following the aforementioned step, it is possible to cover the whole surface of the substrate in two steps.

Moreover, it is possible to use the sputtering apparatus in which a film formation material is generated from a source (target) with a large area, and the film formation is conducted on the whole surface of the substrate by moving the generation point of the material and not moving the substrate. An example of the aforementioned apparatus is the sputtering apparatus 40 illustrated in FIG. 5 which uses an RF sputtering method in which the film formation is conducted while the position of a magnet of cathode is moved in a target by swinging or rotating a magnet. Moreover, in the case where film formation is conducted by the RF sputtering method, it is possible to use an apparatus that can move both of the substrate and the cathode. Furthermore, it is possible to use an apparatus in which the cathode of a material generation source (see the target plate 43 of FIG. 5) is positioned to the vicinity of the substrate, to thereby provide the generated plasma to the substrate not in a beam shape but in a shape of surrounding the substrate. This apparatus enables the simultaneous film formation of the surface and the lateral sides of the substrate.

(Ultimate Vacuum Degree of Film Formation Apparatus)

In the manufacturing method of the present embodiment, the ultimate vacuum degree within the chamber 41 of the sputtering apparatus (film formation apparatus) 40, which is used for the formation of the buffer layer 12, is preferably set to $1.5 \times 10^{-3}$ Pa or less, and the buffer layer 12 is preferably formed after the vacuum degree within the chamber 41 was set within the aforementioned range.

As described above, when the buffer layer is formed by a reactive sputtering method, the impurities attached to the inner wall of the chamber 41 of the sputtering apparatus 40, which is typified by an oxygen-containing material such as moisture, is knocked out from the inner wall of the chamber 41 during the sputtering film formation process, and the impurities are inevitably mixed in the film of the buffer layer 12 formed on the substrate 11. It is considered that these impurities such as an oxygen-containing material are generated mainly because oxygen and moisture in the atmosphere invade in the chamber 41 when the chamber 41 is opened to the atmosphere for maintenance, and are attached to the inner wall.

The present inventors have intensively studied and have found that the matching between the substrate and the buffer layer and the orientation of the buffer layer deteriorate for example when a large amount of oxygen is mixed in the buffer layer formed on the substrate and the oxygen concentration in the film increases too much. In other words, when a large amount of an oxygen-containing material attaches to the inner wall of the chamber of the sputtering apparatus, a large amount of oxygen is mixed in the film of the buffer layer during sputtering, and the aforementioned problem occurs.

In the manufacturing method of the present embodiment, the ultimate vacuum degree within the chamber 41 of the sputtering apparatus 40, which is used for the formation of the buffer layer 12, is set to $1.5 \times 10^{-3}$ Pa or less, to thereby sufficiently discharge the impurities such as the oxygen-containing material in the chamber 41. In this manner, the impurities such as the oxygen-containing material, which attach the inner wall of the chamber 41 or exist in the space inside the chamber 41, are removed and reduced, followed by the formation of the buffer layer 12.

Thus, the buffer layer 12 made of AlN can be formed in the state where a large amount of impurities are not mixed therein. As a result, the lattice matching between the buffer layer and the substrate 11 made of sapphire is improved, and the buffer layer has good orientation.

(Dummy Discharge)

In the manufacturing method of the present embodiment, in order to more improve the aforementioned ultimate vacuum degree, the dummy discharge without a film formation process is preferably conducted in the chamber 41 of the sputtering apparatus 40 before the sputtering film formation process of the buffer layer 12. In a general dummy discharge, the same discharge program as in the film formation process is conducted without introducing the substrate. By conducting the dummy discharge with use of this method, it is possible to previously knock out the impurities generated under the conditions for the film formation even though it is unknown that what kinds of components are knocked out through what kinds of mechanism.

Moreover, for this dummy discharge, it is possible to set the conditions under which the impurities are more easily knocked out than under the conventional film formation conditions. Examples of the aforementioned condition include the conditions in which the temperature for heating the substrate is set to a high temperature (the heater 44 in the sputtering apparatus 40 illustrated in FIG. 5), or the power for generating plasma is set to a high power.

In addition, the aforementioned dummy discharge and the suction of the inside of the chamber 41 can be simultaneously conducted.

By conducting the aforementioned dummy discharge, it is possible to improve the ultimate vacuum degree inside the chamber before the film formation. Thus, the impurities such as the oxygen-containing material, which attach the inner wall of the chamber 41 or exist in the space inside the chamber 41, can be removed and reduced for more certain. Therefore, the lattice matching between the substrate 11 and the buffer layer 12 is improved, and the orientation of the buffer layer 12 can be more improved.

(Substrate Temperature)

The temperature of the substrate 11 during the formation of the buffer layer 12 is preferably within the range from room temperature to 1,000° C., and more preferably from 400° C. to 800° C. When the temperature of the substrate 11 is lower than the aforementioned lower limit, the buffer layer 12 may not be able to cover the whole surface of the substrate 11, and therefore, the surface of the substrate 11 may be exposed. In addition, it may not be possible to obtain the buffer layer having the desired lattice constants that satisfies the aforementioned relationship.

When the temperature of the substrate 11 is higher than the aforementioned upper limit, the migration of the metal raw material becomes active, which is not appropriate for the buffer layer 12. The room temperature described in the present invention depends on the circumstances of the respective steps, etc., and the specific temperature is within the range from 0° C. to 30° C.

(Power and Bias)

In the present embodiment, when the buffer layer 12 is formed by the reactive sputtering method, the power to be applied to the metal target 47 is preferably set within a range from 1 W/cm$^2$ to 20 W/cm$^2$. By conducting the sputtering film formation with use of the power to be applied to the metal target 47 within the aforementioned range, it is possible to form the buffer layer 12 on the substrate 11 as the alignment layer which has the lattice constants satisfying the aforementioned relationship, the specified anisotropy, and good uniformity.

The present inventors conducted the intensive research, and found that the setting of the power applied to the metal target 47 within the aforementioned range produces the aforementioned effects, and the optimal value is 5 W/cm$^2$.

Moreover, the film formation rate of the buffer layer 12 varies according to the power applied to the metal target 47. When the power was set to 20 W/cm$^2$, the increase of the film thickness of the formed buffer layer was observed. Therefore, the higher power applied to the metal target 47 is preferred with respect to the shortening of a step time, etc.

In the manufacturing method of the present embodiment, by varying the power applied to the metal target 47 during the film formation of the buffer layer 12 made of AlN, it is possible to control the film properties of AlN and the lattice constants that satisfies the aforementioned relationship.

Moreover, in the present embodiment, when the film formation of the buffer layer 12 is formed by the sputtering method, the bias value to be applied to the substrate 11 is preferably 1 W/cm$^2$ or more. By conducting the sputtering film formation with use of the bias value to be applied to the substrate 11 of 1 W/cm$^2$ or more, it is possible to form the buffer layer 12 on the substrate 11 as the alignment layer which has the lattice constants satisfying the aforementioned relationship, the specified anisotropy, and good uniformity.

The bias value to be applied to the substrate 11 is preferably higher, and preferably 2 W/cm$^2$ or more. However, when the bias value to be applied to the substrate 11 is too high, the buffer layer formed on the substrate is etched. Therefore, the bias value to be applied to the substrate 11 needs to be lower than the power to be applied to the metal target 47.

In the manufacturing method of the present embodiment, the bias within the aforementioned range is applied to the substrate 11. Therefore, the energy of the Al element or the nitrogen reactive species in the metal target 47, which collides against the substrate 11, increases, the crystallization of the buffer layer made of AlN is enhanced, and the buffer layer can be controlled to have the lattice constants that satisfies the aforementioned relationship.

(Group V Element-Containing Gas Atmosphere)

As the Group V element-containing gas, a generally known nitrogen compound can be used without any limitation, and ammonia and nitrogen (N$_2$) are preferred because they are easy to handle and relatively inexpensive to purchase.

Ammonia has good decomposition efficiency, and can be used for a film formation at a high growth rate. However, because ammonia is highly reactive and toxic, a detoxifying apparatus and a gas detector are required, and the materials of members used in a reaction apparatus need to have high chemical stability.

When nitrogen (N$_2$) is used as a raw material, a simple apparatus can be used, but a high reaction rate cannot be obtained. However, when nitrogen is used after the decomposition due to an electric field or heat, etc., the film formation rate that is enough for industrial manufacturing can be obtained although being lower than that of ammonia. Therefore, nitrogen (N$_2$) is the most preferable nitrogen source in view of the balance with the cost of an apparatus.

The gas fraction of nitrogen in the Group V element-containing gas, i.e. the ratio of the nitrogen flow rate to the total flow rate of nitrogen (N$_2$) and Ar (inert gas), is preferably more than 20%. When the flow rate ratio of nitrogen is 20% or less, the amount of nitrogen is small, and the metal is precipitated on the substrate 11. Thus, it is not possible to obtain the Group III nitride compound with the crystalline structure that is desired as the buffer layer 12. When the flow rate ratio of nitrogen exceeds 99%, the amount of Ar is too small, and the sputtering rate is significantly lowered. This is not preferred. The gas fraction of nitrogen in the nitrogen-containing gas is more preferably within a range from 40% to 95%, and most preferably within a range from 60% to 80%.

In the present embodiment, by supplying a high concentration of the active nitrogen reactive species on the substrate 11, it is possible to suppress the migration on the substrate 11. Thus, self-assembly can be suppressed, and it is possible to prepare the buffer layer 12 with an appropriate single-crystalline structure. Moreover, when the buffer layer 12 is prepared as the film which has an appropriate single-crystalline structure and the lattice constant satisfying the aforementioned relationship, the crystallinity of the semiconductor layer made of the Group III nitride semiconductor laminated thereon can be well controlled.

(Pressure Inside Chamber)

The pressure inside the chamber 41 during the formation of the buffer layer 12 with use of the reactive sputtering method is preferably 0.2 Pa or higher. When the pressure inside the chamber 41 is lower than 0.2 Pa, the kinetic energy of the generated reactive species becomes too large, the film properties of the formed buffer layer become insufficient. The upper limit of the pressure inside the chamber 41 is not particularly limited. However, when the pressure is 0.8 or more, the dimeric charged particles that contributes the orientation of the film is interacted with charged particles within plasma. Therefore, the pressure inside the chamber 41 is preferably within a range from 0.2 to 0.8 Pa.

(Film Formation Rate)

The film formation rate during the film formation of the buffer layer 12 is preferably within a range from 0.01 nm/s to 10 nm/s. When the film formation rate is lower than 0.01 nm/s, the film does not form a layer but grows in the shape of an island, and it may not be possible to cover the surface of the substrate 11. When the film formation rate is higher than 10 nm/s, the film becomes amorphous and not crystalline.

(Target)

When a mixed crystal is formed as the buffer layer by the reactive sputtering method that uses plasma to activate and react the Group V element-containing gas and the metal material, a mixture of metal materials containing Al, etc. (which does not necessarily form an alloy) can be used as a target. Other than this method, it is possible to use another method in which targets of different materials are prepared, and sputtering is simultaneously performed. For example, in the case of the formation of a film that has a certain composition, a target of mixed materials is used. In the case of the formation of several kinds of films that have different compositions, several targets are placed in the chamber.

[Formation of Semiconductor Layer]

In the manufacturing method of the present embodiment, the ground layer 13 is formed by a conventional MOCVD method on the buffer layer 12 that is formed on the substrate 11. Also, the n-type semiconductor layer 14, the light-emitting layer 15, and the p-type semiconductor layer 16 are further laminated in this order on the ground layer 13, to thereby form the semiconductor layer 20 comprised of these layers.

There is no particular limitation in the method for growing the gallium nitride-based compound semiconductor for forming the ground layer 13, the n-type semiconductor layer 14, the light-emitting layer 15, and the p-type semiconductor layer 16, and any method known to grow a nitride semiconductor may be applied. Besides the abovementioned sputtering method, there can be enumerated MOCVD (Metal Organic Chemical Vapor Deposition), HVPE (Hydride Vapor Phase Epitaxy), and MBE (Molecular Beam Epitaxy). Among these methods, in the MOCVD method, hydrogen (H$_2$) or nitrogen (N$_2$) is employed as a carrier gas, trimethylgallium (TMG) or triethylgallium (TEG) is employed as a Ga (Group III element) source, trimethylaluminum (TMA) or triethylaluminum (TEA) is employed as an Al (Group III element) source, trimethylindium (TMI) or triethylindium (TEI) is employed as an In (Group III element) source, and ammonia (NH$_3$), hydrazine (N$_2$H$_4$), or the like is employed as an N (Group V element) source. In addition, as the n-type dopant, monosilane (SiH$_4$) or disilane (Si$_2$H$_6$) may be employed as a Si source, and an organic germanium compound such as germane gas (GeH$_4$), tetramethylgermanium ((CH$_3$)$_4$Ge), or tetraethylgermanium ((C$_2$H$_5$)$_4$Ge) may be employed as a Ge source. In the MBE method, a germanium element may also be employed as a source of dopant. For example, as the p-type dopant, bis(cyclopentadienyl)magnesium (Cp$_2$Mg) or bis(ethylcyclopentadienyl)magnesium ((EtCp)$_2$Mg) is employed as an Mg source.

The abovementioned gallium nitride-based compound semiconductor may contain any other Group III element other than Al, Ga, and In, and may also contain, if necessary, a dopant element such as Ge, Si, Mg, Ca, Zn, and Be. Furthermore, in some cases, such a gallium nitride-based compound semiconductor contains not only intentionally added elements, but also impurities inevitably contained depending on the film formation conditions, and the like, and trace amounts of impurities contained in raw materials and reaction tube materials.

[Formation of Ground Layer]

In the present embodiment, the ground layer 13 made of a Group III nitride semiconductor is formed by a conventional MOCVD method on the buffer layer 12 that was formed on the substrate 11 using the aforementioned conditions and processes.

In the present embodiment, it is not necessarily that an annealing treatment for the buffer layer 12 be conducted before the formation of the ground layer 13. However, when the film formation of a Group III nitride semiconductor is conducted by a chemical vapor deposition method such as MOCVD, MBE, or VPE, a film is generally subjected to a temperature-increasing process and a temperature-holding process without the growth thereof. Because a Group V raw material gas tends to be circulated in the chamber during these processes, an annealing effect may occur as a result. In addition, a conventional gas can be used without any limitation as a carrier gas to be circulated in the above case, and hydrogen and nitrogen, etc., which are widely used in a chemical vapor deposition method such as MOCVD, can be used. However, when hydrogen, which is comparatively chemically active, is used, there is a possibility that the crystallinity and surface flatness may deteriorate. Therefore, the treatment time is preferably shortened.

In the manufacturing method of the present embodiment, the ground layer 13 is formed by an MOCVD method, but there is no limitation of the lamination method of the ground layer 13. A crystal growth method, which can generate looping of dislocation, can be used without any limitation. In particular, an MOCVD method, an MBE method, and a VPE method can generate migration, and therefore, are preferred in that a film with good crystallinity can be formed. Among them, an MOCVD method is preferably used in that a film with excellent crystallinity can be obtained.

The temperature of the substrate 11 during the formation of the ground layer 13, i.e. the growth temperature of the ground layer 13, is preferably set to 800° C. or more. This is because atomic migration is likely to occur and looping of dislocation easily proceeds as the temperature of the substrate 11 is raised during the growth of the ground layer 13. The temperature of the substrate 11 is preferably 900° C. or more, and most preferably 1,000° C. or more. Moreover, the temperature of the substrate 11 during the formation of the ground layer 13 needs to be lower than the crystal decomposition temperature, and therefore, is preferably 1,200° C. or less. When the temperature of the substrate 11 during the formation of the ground layer 13 is within the aforementioned range, it is possible to obtain the ground layer 13 with good crystallinity.

The ground layer 13, which is formed on the substrate 11 by the manufacturing method of the present embodiment, is made of $Al_XGa_{1-X}N$ ($1 \geq X \geq 0$) and is formed on the buffer layer 12 which satisfies the aforementioned relationship defined in the present invention. Therefore, it is possible to obtain the ground layer 13 with good crystallinity. In addition, it is possible to improve the crystallinity of the respective layers of the n-type semiconductor layer 14, the light-emitting layer 15, and the p-type light-emitting layer 16 which are laminated on the ground layer 13 and constitute the semiconductor layer 20.

Herein, the ground layer 13 made of a Group III nitride semiconductor can be formed by a reactive sputtering method. For a sputtering method, it is possible to use the more simple apparatus than those for use in an MOCVD method and an MBE method. In addition, for the formation of the ground layer 13 by a reactive sputtering method, it is preferable to use a reactive sputtering method in which a Group V raw material (nitrogen) is circulated in a reactor in that crystallinity can be well kept by controlling reaction and that the good crystallinity can be stably reproduced.

[Formation of N-Type Semiconductor]

In the present embodiment, the n-type semiconductor 14 comprised of the n-type contact layer 14a and the n-type clad layer 14b is formed on the ground layer 13 that was formed using the aforementioned conditions and processes. In the present embodiment, the n-type contact layer 14a and the n-type clad layer 14b are formed by a conventional MOCVD method. Moreover, the n-type contact layer 14a can be formed by a reactive sputtering method.

As a film formation apparatus for the formation of the n-type contact layer 14a and the n-type clad layer 14b, the film formation apparatus used for the formation of the ground layer 13 and the light-emitting layer 15 described below can be used with appropriate changes of the respective conditions.

Moreover, in the case where the n-type contact layer 14a is formed by a reactive sputtering method, it is possible to use, as a sputtering apparatus to be used, the same apparatus as the aforementioned sputtering apparatus 40 (see FIG. 5) which was used for the formation of the buffer layer 12. In this case, a material to be used for a target and the film formation conditions such as a gas atmosphere in the chamber 41 may be appropriately changed.

[Formation of Light-Emitting Layer]

The light-emitting layer 15 is formed on the n-type clad layer 14b by a conventionally known MOCVD method.

As exemplified in FIG. 1, the light-emitting layer 15 formed in the present embodiment has a laminated structure starting from a GaN barrier layer and ending with a GaN barrier layer, which is formed by alternate laminations of six barrier layers 15a made of GaN and five well layers 15b made of undoped $In_{0.2}Ga_{0.8}N$.

In addition, in the manufacturing method of the present embodiment, the light-emitting layer 15 can be formed by a conventionally known MOCVD method, by using the film-formation apparatus (MOCVD apparatus) which is the same as that used for forming the ground layer 13 and the n-type clad layer 14b.

[Formation of P-Type Semiconductor Layer]

The p-type semiconductor layer 16 composed of the p-type clad layer 16a and the p-type contact layer 16b is formed on the light-emitting layer 15, that is, a barrier layer 15a serving as the outermost layer of the light-emitting layer 15, with use of a conventionally known MOCVD method.

In the present embodiment, firstly, the p-type clad layer 16a made of Mg-doped $Al_{0.1}Ga_{0.9}N$ is formed on the light-emitting layer 15 (barrier layer 15a serving as the outermost layer), and then the p-type contact layer 16b made of Mg-doped $Al_{0.02}Ga_{0.98}N$ is formed thereon. On this occasion, the same MOCVD apparatus as that used for forming the n-type semiconductor layer 14 and the light-emitting layer 15 can be used for laminating the p-type clad layer 16a and the p-type contact layer 16b.

As described above, as the p-type impurity, not only Mg but also, for example, zinc (Zn) can be used in the same manner.

In addition, the p-type semiconductor layer 16 can be formed by a reactive sputtering method.

<Method for Manufacturing Light-Emitting Diode (LED)>

In the manufacturing method of the present embodiment, as shown in the examples illustrated by the planer diagram of FIG. 2 and the cross-sectional diagram of FIG. 3, the light-emitting diode (the Group III nitride semiconductor light-emitting device) 1 can be produced by forming the transparent positive electrode 17 on the p-type semiconductor layer 16 of the laminated semiconductor 10, which has been formed under the aforementioned conditions and processes, the positive electrode bonding pad 18 on the transparent positive electrode 17, and the negative electrode 19 on the exposed area 14d formed on the n-type contact layer 14a of the n-type semiconductor layer 14.

[Formation of Transparent Positive Electrode]

The transparent positive electrode 17 made of ITO is formed on the p-type contact layer 16b of the laminated semiconductor 10 made by forming the respective layers in the aforementioned methods.

The formation method of the transparent positive electrode 17 is not particularly limited, and the transparent positive electrode 17 can be formed through a commonly used means which is well known in this technological field. In addition, the structure thereof may employ any structure including conventionally well known structures without any limitations.

Moreover, as mentioned above, the material of the transparent positive electrode 17 is not limited to ITO, and it is possible to form this using materials such as AZO, IZO, and GZO.

Furthermore, after the formation of the transparent positive electrode 17, thermal annealing for the purpose of alloying or transparent finishing may be either applied or not applied.

[Formation of Positive Electrode Bonding Pad and Negative Electrode]

The positive electrode bonding pad 18 is further formed on the transparent positive electrode 17 that has been formed on the laminated semiconductor 10. This positive electrode bonding pad 18 can be formed by laminating respective materials of Ti, Al, and Au, for example, from the surface side of the transparent positive electrode 17 through a conventionally well known method.

In addition, upon formation of the negative electrode 19, firstly, the exposed area 14*d* (refer to FIG. 2 and FIG. 3) is formed in the n-type contact layer 14*a* by partially removing the p-type semiconductor layer 16, the light-emitting layer 15, and the n-type semiconductor layer 14 that has been formed on the substrate 11, by a method such as dry etching. Then, on this exposed area 14*d*, the negative electrode 19 of a quadruple layer structure, which is not illustrated in the Drawings, can be formed by laminating respective materials of Ni, Al, Ti, and Au, for example, from the surface side of the exposed area 14*d* through a conventionally well known method.

Then, the wafer in which the transparent positive electrode 17, the positive electrode bonding pad 18, and the negative electrode 19 have been provided on the laminated semiconductor 10 in the abovementioned manner, is subjected to grinding and polishing on the backside of the substrate 11 to make a mirror-like plane, followed by cutting into a 350-nm-square piece, for example. By so doing, a light-emitting device chip (light-emitting device 1) can be formed.

According to the method for manufacturing a Group III nitride semiconductor light-emitting device of the present embodiment as described above, the buffer layer 12 is formed of AlN on the substrate 11, and the lattice constant of a-axis of the buffer layer 12 is smaller than the lattice constant of a-axis of AlN in a bulk state. Therefore, it is possible to form the buffer layer 12 which has a highly uniform crystal and is well aligned. In addition, the crystallinity of the ground layer 13, which is formed on the buffer layer 12, is improved. As a result, it is possible to obtain a Group III nitride semiconductor with good device properties.

In addition, the LED (light-emitting diode) structure is formed by further sequentially laminating the n-type semiconductor layer 14, the light-emitting layer 15, and the p-type semiconductor layer 16 on the ground layer 13. Therefore, it is possible to produce a Group III nitride semiconductor light-emitting device with good light-emitting properties.

Furthermore, according to the manufacturing method of the present embodiment, the impurities that are entered during the formation of the buffer layer 12 are reduced by performing the pretreatment for the substrate 11 and improving the ultimate vacuum degree within the chamber 41 of the sputtering apparatus 40 used in the formation of the buffer layer 12. In addition, the temperature of the substrate 11 and the conditions of the power and bias to be applied are appropriately set. Therefore, it is possible to control the lattice constants of the buffer layer 12 to satisfy the aforementioned relationship.

[Lamp]

A lamp can be constituted through means well known to those skilled in the art by combining the Group III nitride semiconductor light-emitting device of the present invention as explained above with a phosphor. Hitherto, a technique of changing emission colors by combining a light-emitting device with phosphors has been known, and such techniques can be employed without any limitations.

For example, it becomes possible to emit light having a wavelength longer than that of a light-emitting device by properly selecting a phosphor, and further, it is also possible to provide a lamp which can emit white light by mixing a light emitting wavelength of the light-emitting device itself and a wavelength converted by a phosphor.

Moreover, the lamp may be used for any application, such as a bullet shape type for general use, a side view type for use in a back light for a portable display, and a top view type for use in an indicator.

Figure 4:
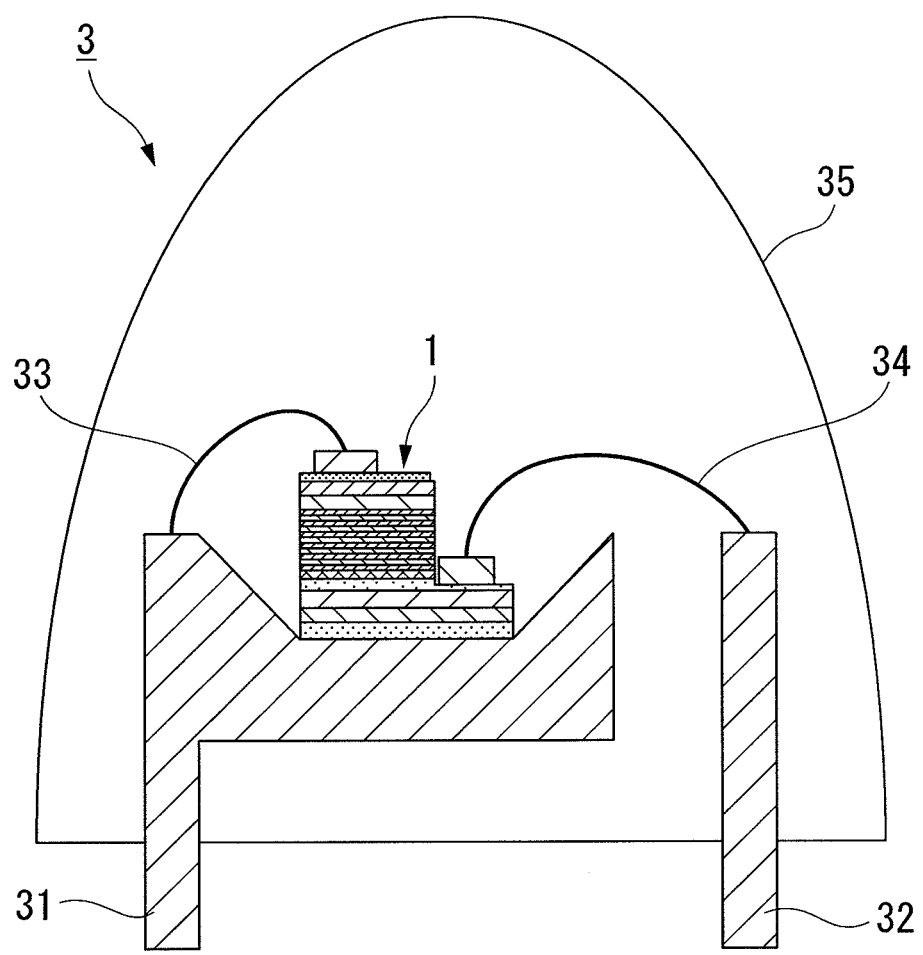
FIG. 4 is a schematic diagram for explaining a lamp constituted by using a Group III nitride semiconductor light-emitting device according to the present invention.

For example, as in the example shown in FIG. 4, when the Group III nitride semiconductor light-emitting device 1 of a type having electrodes on the same surface is to be mounted in a projectile shape: the light-emitting device 1 is bonded to either one of two frames (frame 31 in FIG. 4); a negative electrode of the light-emitting device 1 (refer to reference symbol 19 shown in FIG. 3) is connected to the frame 32 through a wire 34; and a positive electrode bonding pad of the light-emitting device 1 (refer to reference symbol 18 shown in FIG. 3) is connected to the frame 31 through a wire 33. Then, the surroundings of the light-emitting device 1 are molded with a transparent resin 35. By so doing, the projectile-shaped lamp 3 as shown in FIG. 4 can be produced.

In addition, the Group III nitride semiconductor device, which has excellent crystallinity and obtained in the present invention, can be used for photoelectricity conversion devices such as a solar cell and a photo acceptance device, or electronic devices such as HBT (Heterojunction Bipolar Transistor) and HEMT (High Electron Mobility Transistor), besides a semiconductor layer provided in the abovementioned light-emitting device such as a light-emitting semiconductor (LED) or a laser device (LD). Many various structures are known for these semiconductor devices, and the device structure of the laminated structure of the Group III nitride compound semiconductor according to the present invention includes such well known device structures and is not limited at all.

EXAMPLES

Hereunder is a more detailed description of a Group III nitride semiconductor device and a manufacturing method thereof, and a Group III nitride semiconductor light-emitting device and a manufacturing method thereof of the present invention, with reference to Examples. It should be noted that the present invention is not to be limited to these examples.

Example 1

FIG. 1 shows a cross-sectional schematic diagram of the laminated semiconductor of the Group III nitride semiconductor light-emitting device that was produced in the present example.

In the present example, the single crystalline layer made of AlN was formed on the c-plane of the substrate 11 made of sapphire as the buffer layer 12 by the RF sputtering method, and the layer made of GaN (Group III nitride semiconductor) was formed thereon as the ground layer 13 by the MOCVD method.

[Formation of Buffer Layer]

At first, the sapphire substrate having the (0001) c-plane of a diameter of two inches, the surface of which had been mirror finished, was washed with hydrofluoric acid or organic solvent, and was then introduced into the chamber. Here, as the sputtering apparatus, there was employed the apparatus having the high frequency-type power supply and the mechanism capable of moving the position of the magnet within the target such as the sputtering apparatus 40 exemplified in FIG. 5. In addition, the target made of the metal Al was used.

The substrate 11 was heated to 500° C. in the chamber, into which the nitrogen gas was introduced at a flow rate of 15 sccm. Then, while keeping the pressure in the chamber at 1.0 Pa, and applying the high frequency bias of 50 W to the substrate 11, the substrate was exposed to the nitrogen plasma to thereby wash the surface of the substrate 11.

Subsequently, the gas within the chamber was sanctioned by the vacuum pump, and simultaneously, the dummy discharge was repeatedly performed sixteen times, to thereby depressurize the inside of the chamber to the inner pressure of $6.0 \times 10^{-6}$ Pa and remove the impurities.

Subsequently, the argon gas and the nitrogen gas were introduced into the chamber while keeping the temperature of the substrate 11. Under the conditions where the high frequency bias of 2,000 W was applied to the metal Al target side, the pressure in the furnace was maintained at 0.5 Pa, the Ar gas was circulated at a flow rate of 5 sccm, and the nitrogen gas was circulated at a flow rate of 15 sccm (nitrogen ratio in the total gas was 75%), the single crystalline buffer layer 12 made of AlN was formed on the substrate 11 made of sapphire. The magnet in the target was swung at both timings of the substrate 11 washing and the film formation.

On the completion of the formation of the buffer layer 12 made of AlN with a thickness of 40 nm through the process for the time period determined by the measured film formation rate (0.067 nm/s), the plasma operation was stopped, and the temperature of the substrate 11 was lowered.

Then, the X-ray rocking curves for the buffer layer 12 formed on the substrate 11 was measured using the X-ray measurement apparatus (model: X'part Pro MRD, manufactured by Spectris plc). This measurement was conducted using a CuKα X-ray beam generation source was used as the X-ray source. The measurement results revealed that the half maximum full-width of XRC for the buffer layer 12 was 0.10 deg in the measurement of the on the (0002) plane and 1.40 deg in the measurement of the (10-10) plane. It could be confirmed from these good properties that the buffer layer 12 of the present example was well aligned.

In addition, the scanning was conducted by the 2θ-ω method in the X-ray diffraction (XRD), to thereby obtain the 2θ peak position of the grating surface, and the Bragg equation $\{n\lambda = 2d \sin \theta$, d: surface spacing, n: integer, λ: 1.54056 (CuKα)$\}$ was used to calculate the lattice constants of the buffer layer 12 formed on the substrate 11. The results revealed that the buffer layer 12 had the lattice constants of the a-axis of 3.080 Å and the lattice constants of the c-axis of 5.014 Å. Accordingly, it could be found that the buffer layer 12 had the small lattice constant of the a-axis than AlN, satisfied the relationship of represented by the formula $\{(c_0 - c)/(a_0 - a) \geq -1.4\}$, and belonged to the region E2 of the graph shown in FIG. 6 in which the lattice constant of the c-axis was 5 Å or more.

[Formation of Ground Layer]

The substrate 11 having the AlN layer (buffer layer 12) formed thereon was removed from the sputtering apparatus and transported into a MOCVD apparatus, and a ground layer 13 formed of GaN was then formed on the buffer layer 12 using the procedure described below. Herein, a well-known apparatus was used as the MOCVD apparatus for use in the formation of the ground layer 13.

Firstly, the substrate 11 was placed inside the reaction furnace (of the MOCVD apparatus). Subsequently, nitrogen gas was caused to flow through the reaction furnace, and a heater was then activated to raise the substrate temperature from room temperature to 500° C. While the substrate temperature held at 500° C., the ammonia ($NH_3$) gas and the nitrogen gas were circulated, and the pressure inside the vapor deposition reaction furnace was adjusted to 95 kPa (the unit of pressure: Pa). Subsequently, the temperature of the substrate 11 was increased to 1,000° C., and the substrate surface was subjected to thermal cleaning. Even following completion of this thermal cleaning, the supply of nitrogen gas into the vapor deposition reaction furnace was continued.

Thereafter, while the supply of ammonia gas continued, the temperature of the substrate was raised to 1,100° C. in a hydrogen atmosphere, and the pressure inside the reaction furnace was adjusted to 40 kPa. Once it had been confirmed that the substrate temperature had stabilized at 1,100° C., the supply of trimethyl gallium (TMG) into the vapor deposition reaction furnace was commenced, to thereby start the formation of the Group III nitride compound semiconductor (GaN) that constitutes the ground layer 13 on top of the buffer layer 12. Once GaN had been grown in this manner, the TMG supply valve was switched, and the supply of the raw material gas into the reaction furnace was completed, to thereby stop the growth of GaN.

By following the above procedure, a ground layer 13 formed of an undoped GaN layer with a thickness of 8 μm was formed on top of the ground layer 12 formed of single crystalline structure AlN provided on top of the substrate 11. The sample taken off from the inside of the reaction furnace was colorless and transparent, and the surface of the GaN layer (ground layer 13) became a mirror plane.

The X-ray rocking curves (XRC) for the ground layer 13 made of the undoped GaN layer, which was formed in the manner described above, were measured using an X-ray measurement apparatus (model: X'part Pro MRD, manufactured by Spectris plc). The measurements were conducted using a Cuβ X-ray beam generation source as the X-ray source, and were conducted for the symmetrical (0002) plane and the asymmetrical (10-10) plane.

The measurement results revealed that for the undoped GaN layer produced using the production method of the present invention, the half maximum full-width of XRC was 39 arcsec in the measurement of the (0002) plane and 266 arcsec in the measurement of the (10-10) plane. Accordingly, it could be confirmed that the surface flatness and crystallinity of the undoped GaN layer were good.

The aforementioned steps from the pretreatment of the substrate 11 to the formation of the ground layer 13 were used to produce 54 pieces of the samples. In addition, the aforementioned measurement method was used to measure the lattice constants of the buffer layer 12 and the half maximum full-width of XRC for the ground layer 13 in each of the samples. Then, the lattice constants of the a-axis and c-axis for the buffer layer 12 were plotted in the graph, and were represented by the symbol of ◇ in the graph of FIG. 6. As shown in the graph of FIG. 6, it could be confirmed that, in the sample produced in the present example, the relationships of the lattice constants of the a-axis and c-axis of the buffer layer 12 were included in the region E1 or E2 and satisfied the relationship defined in the present invention.

In addition, in the samples produced in the present example, all the values of the half maximum full-width of XRC for the ground layer 13, which were formed on the buffer layer 12, were within the range from 35 to 72 arcsec in the measurement of the (0002) plane and within the range from 204 to 295 arcsec in the measurement of the (10-10) plane. Accordingly, it could be confirmed that the surface flatness and crystallinity of the ground layer 13 were good.

Example 2

In the present example, on the samples obtained by sequentially laminating the buffer layer 12 and the ground layer 13 on the substrate 11, the n-type contact layer 14a, the n-type clad layer 14b, the light-emitting layer 15, and the p-type semiconductor layer 16 were further formed in the manner described below.

[Formation of N-Type Contact Layer]

Next, on the ground layer 13, the initial layer of the n-type contact layer 14a made of GaN was formed using the MOCVD apparatus which was the same as the apparatus used for the formation of the ground layer 13. At this time, the n-type contact layer 14a was doped with Si. The crystal growth was conducted under the same conditions for the ground layer 13 except for circulating $SiH_4$ as the dopant raw material of a of Si.

By the aforementioned process, the buffer layer 12 having a single crystalline structure of AlN was formed on the substrate 11 made of sapphire whose surface was subjected to sputter-cleaning. On the buffer layer 12, the undoped GaN layer (ground layer 13) having a thickness of 8 μm and the Si-doped GaN layer (the initial layer that forms n-type contact layer 14a) having a thickness of 2 μm and a carrier concentration of $5 \times 10^{18}$ cm$^{-3}$ were formed. The substrate taken out from the apparatus after the film formation was colorless and transparent, and the surface of the GaN layer (the initial layer that forms n-type contact layer 14a in this case) was a mirror plane.

[Formation of N-Type Clad Layer and Light-Emitting Layer]

The n-type clad layer 14b and the light-emitting layer 15 were laminated on the n-type contact layer 14a of the sample that had been produced by the above procedure, by a MOCVD method.

[Formation of N-Type Clad Layer]

First, the sample in which the n-type contact layer 14a was grown was transferred into an MOCVD apparatus. Then, ammonia was circulated, nitrogen was used as a carrier gas, and the substrate temperature was lowered to 760° C.

In this case, the supply amount of $SiH_4$ was set while the change of the temperature inside the furnace. The amount of $SiH_4$ to be circulated was preliminarily calculated, and was adjusted such that the electron concentration of the Si dope layer became $4 \times 10^{18}$ cm$^{-3}$.

Next, while the circulation of ammonia was kept in the chamber, a $SiH_4$ gas, and a TMI vapor and a TEG vapor, which had been generated by bubbling, were circulated in the furnace to respectively form the layer made of $Ga_{0.99}In_{0.01}N$ with a thickness of 1.7 nm and the layer made of GaN with a thickness of 1.7 nm. These film formation processes were repeated for 19 cycles, and finally, the layer made of $Ga_{0.99}In_{0.01}N$ with a thickness of 1.7 nm was formed again. While the processes were conducted, the circulation of $SiH_4$ was kept. Thus, the n-type clad layer 14b, which had the superlattice structure made of the Si-doped $Ga_{0.99}In_{0.01}N$ and Si-doped GaN, was formed.

[Formation of Light-Emitting Layer]

Next, the light-emitting layer 15 having a multiquantum well structure comprised of barrier layers 15a made of GaN and well layers 15b made of $Ga_{0.92}In_{0.08}N$ was formed. Upon formation of this light-emitting layer 15, firstly a barrier layer 15a was formed on the n-type clad layer 14b made of Si-doped $Ga_{0.99}In_{0.01}N$, followed by the formation of the well layer 15b made of $Ga_{0.92}In_{0.08}N$ on this barrier layers 15a. After five times repetition of such a lamination procedure, a sixth barrier layer 15a was formed on a well layer 15b that had been laminated at the fifth time, to make a structure in which barrier layers 15a were disposed on both sides of the light-emitting layer 15 of a multiquantum well structure.

Firstly, the supply of TEG and $SiH_4$ into the furnace was started while keeping the temperature of the substrate 11 to 760° C. This supply was continued for the predetermined time to form the initial barrier layer made of Si-doped GaN with a thickness of 0.8 nm, and then the supply of TEG and $SiH_4$ was stopped. Thereafter, the temperature of the susceptor was increased to 920° C. Then, the supply of TEG and $SiH_4$ into the furnace was restarted, and the growth of the middle barrier layer with a thickness of 1.7 nm was further conducted while keeping the substrate temperature at 920° C. Thereafter, the supply of TEG and $SiH_4$ into the furnace was stopped. Subsequently, the temperature of susceptor was lowered to 760° C., the supply of TEG and $SiH_4$ was started, and the growth of the final barrier layer with a thickness of 3.5 nm was conducted. Then, the supply of TEG and $SiH_4$ was stopped again, and the growth of the GaN barrier layer was completed. By the 3-stage film formation process described above, the Si-doped GaN barrier layer (barrier layer 15a) was formed, which was comprised of the 3 layers of the initial bather layer, the middle barrier layer, and the final barrier layer and had the total thickness of 6 nm. The amount of $SiH_4$ was adjusted such that the Si concentration became $1 \times 10^{17}$ cm$^{-3}$.

Next, on completion of growth of the GaN barrier layer (bather layer 15a), TEG and TMI were supplied into the furnace, and the film formation of a well layer was conducted to form the $Ga_{0.92}In_{0.08}N$ layer (the well layer 15b with a thickness of 3 nm.

Then, on completion of growth of the well layer 15b made of $Ga_{0.92}In_{0.08}N$, the supply amount of TEG was changed. Subsequently, the supply of TEG and $SiH_4$ was restarted, and the barrier layer 15a was formed as the second layer.

The aforementioned processes were repeated five times to thereby form the five bather layers 15a made of si-doped GaN and the five well layers 15b made of $Ga_{0.92}In_{0.08}N$.

On completion of the formation of the fifth well layer 15b made of $Ga_{0.92}In_{0.08}N$, the sixth barrier layer was subsequently formed. In the film formation of the sixth bather layer, firstly, the supply of $SiH_4$ was stopped, and the initial bather layer made of undoped GaN was formed. While keeping the supply of TEG into the furnace, the substrate temperature was increased to 920° C. The growth of the middle barrier layer was conducted at the substrate temperature of 920° C. for the predetermined time, and thereafter, the supply of TEG into the furnace was stopped. Subsequently, the substrate temperature was lowered to 760° C., the supply of TEG was started, and the growth of the final bather layer was conducted. Then, the supply of TEG was stopped again, and the growth of the GaN barrier layer was completed. Thereby, the barrier layer was formed, which was comprised of the 3 layers of the initial bather layer, the middle bather layer, and the final bather layer, was made of undoped GaN, and had the total thickness of 4 nm (see the top layer of the bather layer 15a in the light-emitting layer 15 illustrated in FIG. 1 and FIG. 3).

The aforementioned process was used to form the light-emitting layer 15 having a multiquantum well structure that included the well layers with uneven thickness (see the first to fourth well layers 15b from the side of the n-type semiconductor layer 14 layer illustrated in FIG. 1 and FIG. 3) and the well layer with even thickness (see the fifth well layer 15b from the side of the n-type semiconductor layer 14 illustrated in FIG. 1 and FIG. 3).

[Formation of P-Type Semiconductor Layer]

Following the aforementioned respective processes, the p-type clad layer 16a, which had the superlattice structure comprised of the four layers of undoped $Al_{0.06}Ga_{0.94}N$ and Si-doped GaN and the three layers of Mg-doped GaN, was formed, and on this p-type clad layer 16a, the p-type contact layer 16b made of Mg-doped GaN with a thickness of 200 nm was formed, to thereby prepare the p-type semiconductor layer 16.

Firstly, the substrate temperature was increased to 975° C. while supplying the $NH_3$ gas, and thereafter, the carrier gas was switched from nitrogen to hydrogen at this temperature. Subsequently, the substrate temperature was changed into 1050° C. Then, TMG and TMA were supplied into the furnace, to thereby form the layer made of undoped $Al_{0.06}Ga_{0.94}N$ with a thickness of 2.5 nm. Subsequently, without interval, the valve of TMA was closed, and the valve of $Cp_2Mg$ was opened, to thereby form the layer made of Mg-doped GaN with thickness of 2.5 nm.

The aforementioned operation was repeated three times, and finally, the layer made of undoped $Al_{0.06}Ga_{0.94}N$ was formed, to thereby form the p-type clad layer 16a having the superlattice structure.

Thereafter, only Cp2Mg and TMG were supplied into the furnace, to thereby form the p-type contact layer 16b made of the p-type GaN with a thickness of 200 nm.

The epitaxial wafer for an LED produced by the above manner had the structure in which the AlN layer (buffer layer 12) having the single crystalline structure was formed on the substrate 11 made of sapphire having a c-plane, followed by lamination of: sequentially from the substrate 11 side, the undoped GaN layer (ground layer 13) with a thickness of 8 μm; the n-type contact layer 14a made of the Si-doped GaN initial layer having an electron concentration of $5 \times 10^{18}$ cm$^{-3}$ with a thickness of 2 μm and the Si-doped GaN regrowth layer with a thickness of 200 nm; the n-type clad layer 14b having the Si concentration of $4 \times 10^{18}$ cm$^{-3}$ and the superlattice structure made of the twenty $Ga_{0.99}In_{0.01}N$ layers with a thickness of 1.7 nm and the nineteen GaN layers with a thickness of 1.7 nm; the light-emitting layer 15 with the multiquantum well structure comprised of the five Si-doped GaN barrier layers (barrier layer 15a) with a thickness of 6 nm, the five undoped $Ga_{0.92}In_{0.08}N$ well layers (well layer 15b) with a thickness of 3 nm, and the final barrier layer made of undoped GaN (see the top layer of the barrier layer 15a in the light-emitting layer 15 illustrated in FIG. 1 and FIG. 3); the p-type clad layer 16a having the superlattice structure comprised of the four layers made of undoped $Al_{0.06}Ga_{0.94}N$ with a thickness of 2.5 nm and the three layers made of Mg-doped $Al_{0.01}Ga_{0.99}N$ with a thickness of 2.5 nm; and the p-type semiconductor layer 16 comprised of the p-type contact layer 16b made of Mg-doped GaN with a thickness of 200 nm.

Example 3

In the present example, an LED was produced by forming the respective electrodes on the epitaxial wafer obtained in Example 2 (see the laminated semiconductor 10 illustrated in FIG. 1).

Firstly, on the surface of the Mg-doped AlGaN layer (p-type semiconductor layer 16b) of the abovementioned epitaxial wafer was formed a transparent electrode 17 made of ITO by a well known photolithographic method. A positive electrode bonding pad 18 (p electrode bonding pad) having a laminated structure of titanium, aluminum, and gold in this order, was formed thereon for use as a p-side electrode. Furthermore, the wafer was subjected to dry etching to expose an area to be formed with an n-side electrode (negative electrode) of the n-type contact layer 14a. Then, on this exposed area 14d was formed a negative electrode 19 (n-side electrode) comprised of a lamination of three layers of Cr, Ti, and Au in this order. By such a procedure, on the wafer (refer to the laminated semiconductor 10 of FIG. 1) were formed the respective electrodes in the shapes as shown in FIG. 2.

Then, the wafer formed with the respective p-side and n-side electrodes by the abovementioned procedure was subjected to grinding and polishing on the backside of the substrate 11 made of sapphire to make a mirror-like plane. Then, the wafer was cut into the 350-μm-square sample chips, and this chip was disposed on a lead frame so that the respective electrodes faced upward, and was connected to the lead frame by gold wires to produce a light-emitting device (see the lamp 3 of FIG. 4).

A forward current was applied to between the p-side and n-side electrodes of the light emitting diode produced by the above manner. As a result, the forward voltage at a current of 20 mA was within a range from 3.1 V to 3.3 V. In addition, the emitting state from each of the sample chips was observed through the p-side transparent electrode 17, which showed that the emission wavelength was within a range from 450 nm to 460 nm and the emission output was within the from 17 mW to 19 mW. Such characteristics of the light emitting diode were uniformly obtained in the light emitting diode produced from almost the entire surface of the thus produced wafer.

Experimental Example

In the present example, the single crystalline layer made of AlN was formed on the c-plane of the substrate 11 made of sapphire as the buffer layer 12 by the MOCVD method, and the layer made of GaN (Group III nitride semiconductor) was formed thereon as the ground layer 13 by the MOCVD method.

In the present experiment, the substrate 11 was transported into a MOCVD apparatus, and AlN (the buffer layer 12) was formed by the following process. Herein, a well-known apparatus was used as the MOCVD apparatus for use in the formation of the buffer layer 12.

Firstly, the substrate 11 was placed inside the reaction furnace (of the MOCVD apparatus). Subsequently, nitrogen gas was caused to flow through the reaction furnace, and a heater was then activated to raise the temperature of the substrate 11 from room temperature to 1,170° C. While the temperature of the substrate 11 is held at 1,170° C., the hydrogen gas and the nitrogen gas were circulated, and the surface of the substrate 11 was subjected to thermal cleaning. Even following completion of this thermal cleaning, the supply of nitrogen gas into the vapor deposition reaction furnace was stopped, and the gas to be supplied into the furnace was limited to only hydrogen.

After the carrier gas was changed in the aforementioned process, the temperature of the substrate 11 was lowered to 1,150° C. Once it had been confirmed that the temperature of the substrate 11 had stabilized at 1,150° C., the ammonia supply valve was opened, and the circulation of ammonia into the furnace was started. Subsequently, the trimethyl aluminum (TMA) vapor-containing gas was supplied into the furnace, to thereby grow AlN (buffer layer 12) on the substrate 11. After such process was conducted for 6 minutes, the supply of the TMA vapor-containing gas into the furnace was stopped. Subsequently, the supply of ammonia was also stopped, and this state was hold for 3 minutes.

Thereafter, while the supply of ammonia gas was restarted, the temperature of the substrate 11 was lowered to 1,100° C. in a hydrogen atmosphere. Once it had been confirmed that the temperature of the substrate 11 had stabilized at 1,100° C., the supply of trimethyl gallium (TMG) into the vapor deposition reaction furnace was commenced, to thereby start the formation of the Group III nitride compound semiconductor (GaN) that constitutes the ground layer 13 on top of the buffer layer 12. Once GaN had been grown in this manner, the TMG supply valve was switched, and the supply of the raw material gas into the reaction furnace completed, to thereby stop the growth of GaN.

By following the above procedure, a ground layer 13 formed of an undoped GaN layer with a thickness of 8 µm was formed on top of the ground layer 12 formed of AlN provided on top of the substrate 11.

Then, the supply of TMA was stopped, and the substrate 11 was taken off from the inside of the reaction furnace on the completion of the film formation of the AlN (buffer layer 12), to thereby produce the sample in which only the AlN (buffer layer 12) was formed on the substrate 11.

The X-ray rocking curves (XRC) and the lattice constants for the buffer layer 12, which was formed on the buffer layer 11 in the manner described above, were measured and calculated using the same method as in Example 1. It was confirmed that the half maximum full-width of XRC was 0.51 deg in the measurement of the (0002) plane and 0.91 deg in the measurement of the (10-10) plane. In addition, it was confirmed that the lattice constants of the buffer layer 12 was 3.109 Å for the a-axis and 4.993 Å for the c-axis and that the relationships of the lattice constants of the a-axis and c-axis were included in the region E3 of the graph shown in FIG. 6.

Moreover, the formation of the ground layer 13 was followed by the visual check of the surface thereof, which showed that the GaN (ground layer 13) was colorless and transparent, but coarser than the surface of the ground layer 13 in Example 1. The X-ray rocking curves (XRC) for the GaN ground layer were measured by the same method in Example 1, and the half maximum full-width of XRC was 198 arcsec in the measurement of the (0002) plane and 327 arcsec in the measurement of the (10-10) plane. Accordingly, it was confirmed that the surface flatness and crystallinity were poorer than those in Example 1.

Comparative Example

The buffer layer was laminated on the substrate in the same process as Example 1 except that the pretreatment for the substrate which used a plasma treatment was not conducted, the ultimate vacuum degree within the chamber before the film formation was appropriately set to the vacuum degree of the higher pressure than $1.0 \times 10^{-3}$ Pa, and the total thickness was adjusted to more than 500 nm or less than 10 nm. In addition, the undoped GaN layer (ground layer) was laminated on the buffer layer.

The X-ray rocking curves (XRC) for the buffer layer formed on the substrate were measured and calculated using the same method as in Example 1, and the half maximum full-width of XRC was 0.29 deg in the measurement of the (0002) plane and 2.10 deg in the measurement of the (10-10) plane. In addition, it was confirmed that the lattice constants of the buffer layer was 3.117 Å for the a-axis and 4.982 Å for the c-axis and that the relationships of the lattice constants of the a-axis and c-axis were included in the region E3 of the graph shown in FIG. 6 which is aside from the regions E1 and E2 in which the relationship defined in the present invention is satisfied.

Moreover, after the film formation, the substrate was taken out from the chamber and subjected to the visual check, which showed that the substrate surface, i.e. the surface of the GaN ground layer, was colorless but had cracks in an opaque state. The X-ray rocking curves (XRC) for the GaN ground layer were measured by the same method in the aforementioned example, and the half maximum full-width of XRC was 172 arcsec in the measurement of the (0002) plane and 426 arcsec in the measurement of the (10-10) plane. Accordingly, it was confirmed that the surface flatness and crystallinity were poorer than those in Example 1.

Then, the aforementioned steps of the formation of the buffer layer and the ground layer on substrate were used to produce 10 pieces of the samples. In addition, the aforementioned measurement method was used to measure the lattice constants of the buffer layer and the half maximum full-width of XRC for the ground layer in each of the samples of Comparative examples. Then, the lattice constants of the a-axis and c-axis for the buffer layer were plotted in the graph, and were represented in the graph of FIG. 6. In the samples (total 7 pieces) that were plotted by the symbol of □ in the graph of FIG. 6, the each half maximum full-width of XRC was 100 arcsec or more in the measurement of the (0002) plane, and it was confirmed that the crystallinity was poor. In the samples (total 3 pieces) that were plotted by the symbol of Δ, the surface troubles were observed, and it was confirmed that the surface flatness was poor. As shown in the graph of FIG. 6, the following results were obtained. In the sample produced under the comparative example, the relationships of the lattice constants of the a-axis and c-axis of the buffer layer 12 were aside from the region E1 or E2 and included in the region E3.

From the above results, it is apparent that the Group III nitride semiconductor according to the present invention has good crystallinity and excellent device characteristics, and the Group III nitride semiconductor light-emitting device according to the present invention, which includes an LED (Light Emitting Diode) structure, has excellent light emission characteristics.

The invention claimed is:

1. A Group III nitride semiconductor device which is obtained by laminating at least a buffer layer made of a Group III nitride compound and a ground layer made of a Group III nitride semiconductor, which is formed on the buffer layer, on a substrate, wherein
    the buffer layer is formed of a single crystalline structure,
    the buffer layer is made of AlN,
    a thickness of the buffer layer is within a range of 20 to 100 nm,
    a lattice constant of a-axis of the buffer layer is smaller than a lattice constant of a-axis of AlN in a bulk state,
    the ground layer is made of GaN and is in contact with the buffer layer, and
    lattice constants of the buffer layer satisfy a relationship represented by a formula (1):

$$(c_0-c)/(a_0-a) \geq -1.4 \quad (1)$$

wherein in the formula (1), $c_0$ represents a lattice constant of c-axis of a bulky AlN, c represents a lattice constant of c-axis of the buffer layer, $a_0$ represents a lattice constant a-axis of bulky AlN, and a represents a lattice constant of a-axis of the buffer layer.

2. The Group III nitride semiconductor device according to claim 1, wherein a lattice constant of c-axis of the buffer layer is 5 Å or more.

3. The Group III nitride semiconductor device according to claim 1, wherein a half maximum full-width of X-ray rocking curve of a (0002) plane of the ground layer is 100 arcsec or less.

4. The Group III nitride semiconductor device according to claim 1, wherein a half maximum full-width of X-ray rocking curve of a (10-10) plane of the ground layer is 300 arcsec or less.

5. A Group III nitride semiconductor light-emitting device which is obtained by sequentially laminating at least an n-type semiconductor layer, a light-emitting layer, and a p-type semiconductor layer on the ground layer of the Group III nitride semiconductor device according to claim 1.

6. A method for manufacturing a Group III nitride semiconductor device, comprising: laminating at least a buffer layer made of a Group III nitride compound and a ground layer made of a Group III nitride semiconductor, which is formed on the buffer layer, on a substrate, wherein a thickness of the buffer layer is within a range of 20 to 100 nm, the buffer layer is formed of a single crystalline structure, the buffer layer is made of AlN under a condition where a lattice constant of a-axis of the buffer layer is smaller than a lattice constant of a-axis of AlN in a bulk state' the ground layer is made of GaN and is in contact with the buffer layer, and lattice constants of the buffer layer satisfy a relationship represented by a formula (1):

$$(c_0-c)/(a_0-a) \geq -1.4 \qquad (1)$$

wherein in the formula (1), $c_0$ represents a lattice constant of c-axis of a bulky AlN, c represents a lattice constant of c-axis of the buffer layer, $a_0$ represents a lattice constant a-axis of bulky AlN, and a represents a lattice constant of a-axis of the buffer layer.

7. The method for manufacturing a Group III nitride semiconductor device according to claim 6, wherein the ground layer is formed on the buffer layer by using an MOCVD method.

8. A method for manufacturing a Group III nitride semiconductor light-emitting device, comprising sequentially laminating at least an n-type semiconductor layer, a light-emitting layer, and a p-type semiconductor layer on the ground layer of the Group III nitride semiconductor device obtained by the manufacturing method according to claim 6.

9. A lamp which comprises the Group III nitride semiconductor light-emitting device according to claim 5.

10. The method for manufacturing a Group III nitride semiconductor device according to claim 6, wherein the buffer layer is formed by using plasma to activate and react a Group V element-containing gas and a metal material.

* * * * *